(12) United States Patent
Gundel et al.

(10) Patent No.: US 12,066,470 B2
(45) Date of Patent: Aug. 20, 2024

(54) MULTICHANNEL ELECTRICAL POWER GRID MONITORING SYSTEM FOR DETECTING AND ANALYZING SENSOR INSTALLATION AND CONFIGURATION ERRORS

(71) Applicants: 3M Innovative Properties Company, St. Paul, MN (US); Connected Intelligence Systems Ltd., Netanya (IL)

(72) Inventors: Douglas B. Gundel, St. Paul, MN (US); Udi Blich, Ichud (IL); Eyal Doron, Caesarea (IL)

(73) Assignees: 3M Innovative Properties Company, St. Paul, MN (US); Connected Intelligence Systems Ltd., Netanya (IL)

( * ) Notice: Subject to any disclaimer, the term of this patent is extended or adjusted under 35 U.S.C. 154(b) by 249 days.

(21) Appl. No.: 17/597,881

(22) PCT Filed: Jul. 30, 2020

(86) PCT No.: PCT/US2020/044242
§ 371 (c)(1),
(2) Date: Jan. 27, 2022

(87) PCT Pub. No.: WO2021/025947
PCT Pub. Date: Feb. 11, 2021

(65) Prior Publication Data
US 2022/0260616 A1  Aug. 18, 2022

Related U.S. Application Data

(60) Provisional application No. 62/882,426, filed on Aug. 2, 2019.

(51) Int. Cl.
G01R 25/00 (2006.01)
G01R 19/175 (2006.01)
G01R 35/00 (2006.01)

(52) U.S. Cl.
CPC ......... *G01R 19/175* (2013.01); *G01R 35/005* (2013.01)

(58) Field of Classification Search
CPC ................. G01R 19/175; G01R 19/2513; G01R 35/005; G01R 31/58; G01R 31/086; G01R 15/142
See application file for complete search history.

(56) References Cited

U.S. PATENT DOCUMENTS 9,961,418 B2   5/2018  Rodriguez, Jr. et al.
10,330,812 B1  6/2019  Barnett et al.
(Continued)

FOREIGN PATENT DOCUMENTS

CN    204650329 U    9/2015
DE    102016104874 A1   9/2017
(Continued)

OTHER PUBLICATIONS

International Preliminary Report on Patentability from International Application No. PCT/US2020/044242, dated Feb. 17, 2022, 14 pp.
(Continued)

*Primary Examiner* — Thang X Le
(74) *Attorney, Agent, or Firm* — Shumaker & Sieffert, P.A.

(57) ABSTRACT

Techniques, methods, systems and articles are described for monitoring electrical equipment of a power grid, identifying installation and/or configuration errors of such electrical equipment, and automatically correcting the errors. In one example, a system includes at least one processor and a plurality of sensors coupled to a multi-phase power line comprising a plurality of electrical cables that are each
(Continued)

associated with a respective phase. The plurality of sensors are configured to generate sensor data that is indicative of one or more conditions of the electrical cables. The at least one processor is configured to receive the sensor data and determine, based at least in part on the sensor data, whether a sensor of the plurality of sensors is installed correctly. The at least one processor is also configured to perform an action in response to determining that the sensor is not installed correctly.

20 Claims, 9 Drawing Sheets

(56) References Cited

U.S. PATENT DOCUMENTS

| | | | |
|---|---|---|---|
| 2010/0114392 | A1 | 5/2010 | Lancaster |
| 2010/0179779 | A1 | 7/2010 | Taft |
| 2013/0054162 | A1 | 2/2013 | Smith et al. |
| 2015/0301122 | A1 | 10/2015 | Lee |
| 2016/0054363 | A1 | 2/2016 | Rostron et al. |
| 2016/0225248 | A1 | 8/2016 | Rodriguez, Jr. et al. |
| 2017/0052222 | A1* | 2/2017 | Pasdar .................... H02H 7/26 |
| 2017/0144560 | A1 | 5/2017 | Park et al. |
| 2017/0336464 | A1* | 11/2017 | Blumschein ......... G01R 31/086 |
| 2018/0198284 | A1* | 7/2018 | Yasui ....................... H02M 5/40 |
| 2019/0086461 | A1 | 3/2019 | Dale |
| 2020/0309828 | A1* | 10/2020 | Ahn ..................... G01R 22/063 |

FOREIGN PATENT DOCUMENTS

| | | |
|---|---|---|
| JP | H06160459 A | 6/1994 |
| JP | 2013025323 A | 2/2013 |
| JP | 3252908 | * 12/2017 |

OTHER PUBLICATIONS

Response to First Examination Report dated Jul. 25, 2022, from counterpart Indian Application No. 202247010106 filed Dec. 29, 2022, 19 pp.

International Search Report and Written Opinion of International Application No. PCT/US2020/044242, dated Nov. 10, 2020, 21 pp.

First Examination Report from counterpart Indian Application No. 202247010106 dated Jul. 25, 2022, 8 pp.

Hearing Notice from counterpart Indian Application No. 202247010106 dated Jan. 17, 2024, 5 pp.

Written Submissions from counterpart IN Application 202247010106, filed Feb. 20, 2024, 19 pp.

Search Report from counterpart Application No. BR1120220018673 dated Apr. 22, 2024, 7 pp.

Communication pursuant to Article 94(3) EPC from counterpart European Application No. 20757735.4 dated Mar. 26, 2024, 12 pp.

* cited by examiner

MULTICHANNEL ELECTRICAL POWER GRID MONITORING SYSTEM FOR DETECTING AND ANALYZING SENSOR INSTALLATION AND CONFIGURATION ERRORS

This application claims priority to U.S. Provisional Application No. 62/882,426, filed Aug. 2, 2019, the entire contents of which are incorporated herein by reference.

TECHNICAL FIELD

The present disclosure relates to the field of electrical equipment, including power cables and accessories, for power utilities.

BACKGROUND

Typically, an electrical power grid includes several multi-phase power lines, each multi-phase power line including individual electrical cables each assigned to a different phase. Sensors are sometimes installed on individual electrical cables within the electrical power grid to monitor various characteristics of the individual power cable. Often, several power cables are located in the same area. For example, a power delivery node, such as an underground vault (e.g., accessible via a manhole), may provide access to several multi-phase power lines. A technician who accesses the power delivery node (e.g., to service an individual electrical cable or an entire multi-phase power line) may have difficulty correctly identifying which electrical cables are associated with which electrical phase. Further, the technician may have difficulty determining which electrical cables are associated with a single power line (e.g., which three cables constitute a single three-phase power line). A technician may install sensors incorrectly when servicing the electrical cables, for example, by installing sensors on the wrong electrical cables or installing the sensors backwards. Installing sensors incorrectly may make it more difficult to detect faults in the electrical cables, which may increase the time and cost to identify and correct faults when they occur.

SUMMARY

The present disclosure describes various example implementations of a multichannel electrical power grid monitoring system for capturing and analyzing streams of sensed data from an electrical power grid to detect, diagnose and correct errors, such as installation or configuration errors with components of the power grid. In one example, the electrical grid includes a plurality of multi-phase power lines, each multi-phase power line including an electrical cable for each respective phase of the multiple phases. A grid monitoring system monitors one or more streams of sensed data generated by remote sensors affixed to or otherwise associated with components of the power grid for each phase of the multi-phase power line.

As further described herein, one or more computing systems of the grid monitoring system monitors sensor data from a power grid and determines whether one or more sensors have been installed correctly. In one example, the computing system determines whether a sensor is installed correctly by determining whether an orientation of the sensor corresponds to the expected orientation (e.g., whether the sensor is installed backwards). In another example, the computing system determines whether the sensor is installed correctly by determining whether an electrical phase assigned to the sensor corresponds to (e.g., matches, or is the same as) an electrical phase assigned to the electrical cable to which the sensor is attached. In yet another example, the computing system determines whether the sensor is installed correctly by determining whether the sensor is calibrated correctly.

The computing system, in some examples, determines a "fingerprint" for a particular electrical cable and/or a particular multi-phase power line, where the term fingerprint is used herein to generally refer to data indicative of various electrical characteristics of the particular electrical cable and/or power line. For example, a fingerprint of a particular electrical power cable may include data indicative of the voltage and/or current amplitude, frequency offsets, harmonic distortion patterns, voltage amplitude offsets, among others. The computing system may determine whether two sensors installed at different locations are installed on the same electrical cable and/or power line based on the fingerprint.

In this way, as the system receives sensor data, the system may more accurately identify power lines and individual electrical cables. Identifying the power lines and individual electrical cables more accurately may enable a technician to locate specific electrical cables more quickly and more accurately in the event of a failure event or predicted failure event. By locating and identifying electrical cables more quickly and more accurately may enable the technician to service the power lines more quickly, which may reduce the time and expense in maintaining the power grid.

Moreover, in some implementations, the multichannel electrical power grid monitoring system described herein may implement "self-healing" techniques so as to automate the correction of one or more detected errors. For example, power grid monitoring system may include a diagnostic engine configured to automatically diagnose installation and/or configuration errors and a self-healing module configured to automatically correct the installation and/or configuration errors. Automatically diagnosing and correcting the installation and configuration errors may enable the system to identify power lines and individual electrical cables despite the installation or configuration errors, which may enable a technician to locate and service electrical cables more quickly in the event of a failure or predicted failure event.

In some examples, a system includes at least one processor and a plurality of sensors coupled to a multi-phase power line comprising a plurality of electrical cables that are each associated with a respective phase, the plurality of sensors configured to generate sensor data that is indicative of one or more conditions of the electrical cables. The at least one processor is configured to: receive the sensor data; determine, based at least in part on the sensor data, whether a sensor of the plurality of sensors is installed correctly; and responsive to determining that the sensor is not installed correctly, perform an action.

In some examples, a method includes receiving, by a computing system, sensor data generated by a plurality of sensors coupled to a multi-phase power line comprising a plurality of electrical cables that are each associated with a respective phase, the sensor data indicative of one or more conditions of the electrical cables. The method also includes determining, by the computing system, based at least in part on the sensor data, whether a sensor of the plurality of sensors is installed correctly; and responsive to determining that the sensor is not installed correctly, performing, by the computing system, an action.

The details of one or more examples of the disclosure are set forth in the accompanying drawings and the description below. Other features, objects, and advantages of the disclosure will be apparent from the description and drawings, and from the claims.

It is to be understood that the embodiments may be utilized and structural changes may be made without departing from the scope of the invention. The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
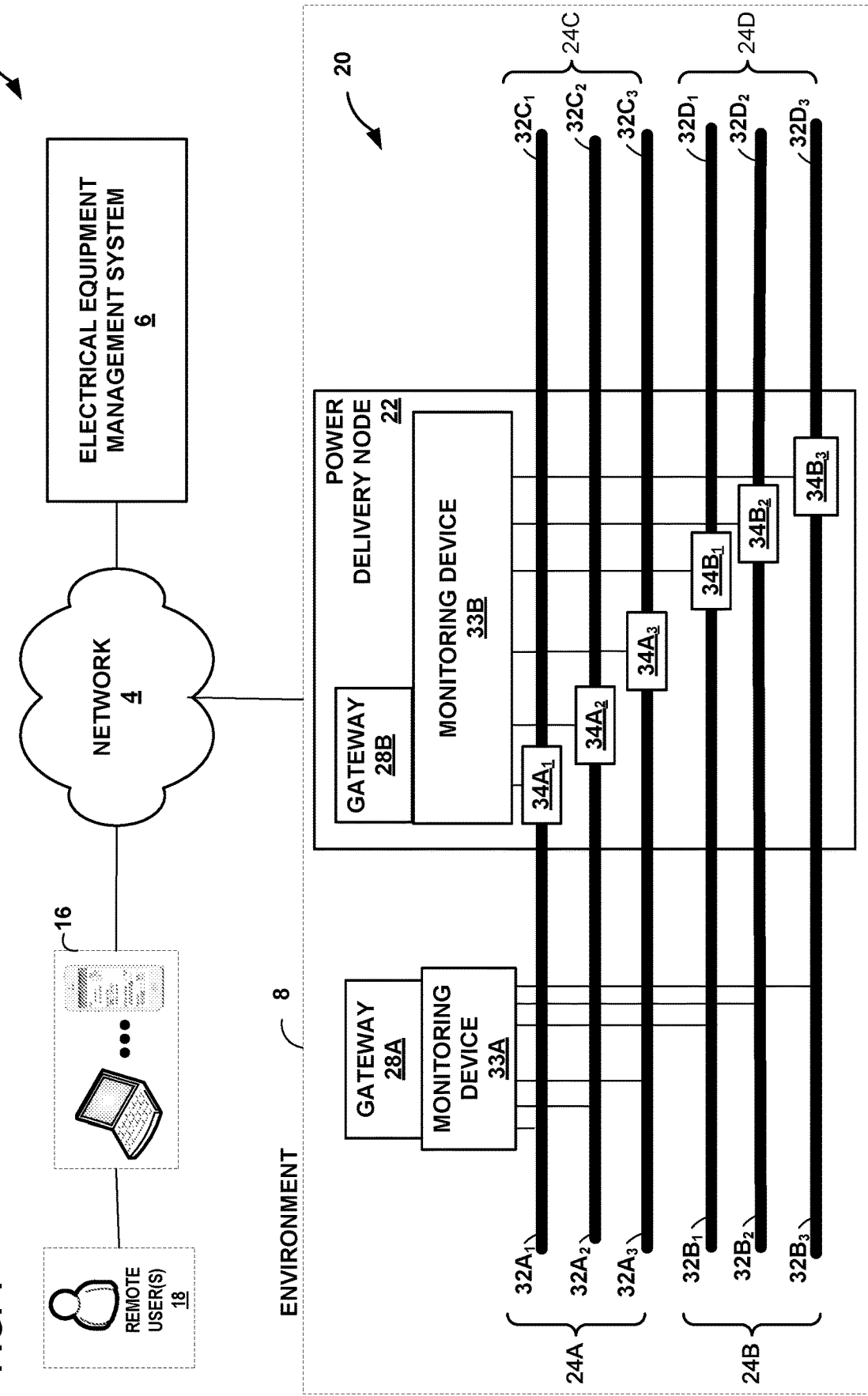
FIG. 1 is a block diagram illustrating an example system in which electrical utility equipment, such as electrical power lines, having embedded sensors and communication capabilities, are managed by an electrical equipment management system (EEMS), in accordance with various techniques of this disclosure.

FIG. 1 is a block diagram illustrating an example computing system 2 that includes an electrical equipment management system (EEMS) 6 for monitoring electrical power cables of an electrical power grid. As shown in the example of FIG. 1, system 2 represents a computing environment in which monitoring devices 33A-33B (collectively, monitoring devices 33) monitor electrical cables within physical environment 8 electronically communicate with EEMS 6 via one or more computer networks 4.

Environment 8 represents a physical environment in which one or more electrical power lines 24A-24D (collectively, power lines 24) provide power from a power source (e.g., power plant) to one or more consumers (e.g., businesses, homes, government facilities, etc.). In the example of FIG. 1, environment 8 includes a plurality of articles of electrical equipment 20, such as a power delivery node 22, one or more power lines 24, and one or more gateways 28A-28B (collectively, gateways 28).

In general, gateways 28 operate as communication devices for relaying communications between EEMS 6 and monitoring devices 33 monitoring respective articles of electrical equipment 20 (e.g., cable cables 32). Gateways 28 may each be communicatively coupled to EEMS 6 via wired and/or wireless communication. For example, gateways 28 may include a cellular radio (e.g., GSM, CDMA, LTE, etc.), Bluetooth® radio, WiFi® radio, low power wide area network (LPWAN), etc. As another example, gateways 28 may include a wired connection, such as a network interface card (e.g. such as an Ethernet card), an optical transceiver, or any other type of device that can send and/or receive data. According to some examples, gateways 28 communicate with other devices using power line communication techniques. In other words, in some examples, gateways 28 communicate with monitoring devices 33 via power lines 24. In some examples, gateways 28 are capable of buffering data in case communication is lost with EEMS 6. Moreover, gateway 28 may be programmable via EEMS 6 so that local alert rules may be installed and executed without requiring a connection to the cloud. As such, gateways 28 may provide a relay of streams of event data from monitoring devices 33, and provide a local computing environment for localized alerting based on streams of events.

Power delivery node 22 may include one or more input power lines to receive power (e.g., directly from a power source or indirectly via another power delivery node 22) and one or more output power lines to directly or indirectly (e.g., via another power delivery node 22) distribute power to consumers (e.g., homes, businesses, etc.). Power delivery node 22 may include a transformer to step voltages up or down. In some examples, power delivery node 22 may be a relatively small node to distribute power to homes in a neighborhood, such as an underground vault, an electrical cabinet, a pole-mount transformer, or a pad-mount transformer. As another example, power delivery node 22 may be a relatively large node (e.g., a transmission substation) that distributes power to other power delivery nodes (e.g., distribution substations), such that the other power delivery nodes further distribute power to consumers (e.g., homes, businesses, etc.).

Power lines 24 may transmit electrical power from a power source (e.g., a power plant) to a power consumer, such as a business or home. Power lines 24 may be underground, underwater, or suspended overhead (e.g., from wooden poles, metal structures, etc.). Power lines 24 may be used for electrical power transmission at relatively high voltages (e.g., compared to electrical cables utilized within a home, which may transmit electrical power between approximately 12 volts and approximately 240 volts depending on application and geographic region). For example, power lines 24 may transmit electrical power above approximately 600 volts (e.g., between approximately 600 volts and approximately 1,000 volts). However, it should be understood that power lines 24 may transmit electrical power over any voltage and/or frequency range. For example, lines 24 may transmit electrical power within different voltage ranges. In some examples, a first type of lines 24 may transmit voltages of more than approximately 1,000 volts, such as for distributing power between a residential or small commercial customer and a power source (e.g., power utility). As another example, a second type of lines 24 may transmit voltages between approximately 1 kV and approximately 69 kV, such as for distributing power to urban and rural communities. A third type of lines 24 may transmit voltages greater than approximately 69 kV, such as for sub-transmission and transmission of bulk quantities of electric power and connection to very large consumers.

Power lines 24 include multi-phase power lines (e.g., three-phase power lines) that each include a plurality of electrical cables 32. For example, power line 24A includes electrical cables $32A_1$-$32A_3$ (collectively, electrical cables 32A), power line 24B includes electrical cables $32B_1$-$32B_3$ (collectively, electrical cables 32B), power line 24C includes electrical cables $32C_1$-$32C_3$ (collectively, electrical cables 32C), and power line 24D includes electrical cables $32D_1$-$32D_3$ (collectively, electrical cables 32D). Each of electrical cables 32A-32D (collectively, electrical cables 32) includes a conductor which may be radially surrounded by one or more layers of insulation.

Environment 8 includes cable accessories $34A_1$-$34A_3$ (collectively, cable accessories 34A) and $34B_1$-$34B_3$ (collectively, cable accessories 34B). In the example of FIG. 1, cable accessories 34A and 34B (collectively, cable accessories 34) are located at or within power delivery node 22. Example cable accessories 34 may include splices, separable connectors, terminations, and connectors, among others. In some examples, cable accessories 34 may include cable splices configured to couple (e.g., electrically and physically) two or more cables 32. For example, as shown FIG. 1, cable accessory $34A_1$ electrically and physically couples cable $32A_1$ to cable $32C_1$, cable accessory $34A_2$ electrically and physically couples cable $32A_2$ to cable $32C_2$, cable accessory $34A_3$ electrically and physically couples cable $32A_3$ to cable $32C_3$, cable accessory $34B_1$ electrically and physically couples cable $32B_1$ to cable $32D_1$, cable accessory $34B_2$ electrically and physically couples cable $32B_2$ to cable $32D_2$ and cable accessory $34B_3$ electrically and physically couples cable $32B_3$ to cable $32D_3$. In some examples, terminations may be configured to couple (e.g., electrically and physically) a cable 32 to additional electrical equipment, such as a transformer, switch gear, power substation, business, home, or other structure.

System 2 includes one or more electrical cable monitoring devices 33A-33B (collectively, monitoring devices 33) configured to monitor one or more conditions of an article of electrical equipment 20. For example, monitoring devices 33 may be configured to monitor conditions of power delivery nodes 22, electrical cables 32, cable accessories 34, or other type of electrical equipment 20. Monitoring devices 33 may be configured to attach or otherwise couple to electrical cables 32 and/or cable accessories 34. In some examples, monitoring devices 33 may be integrated within another device, such as cable accessories 34, or may be a separate (e.g., stand-alone) device. In the example of FIG. 1, monitoring device 33B is located within power delivery node 22 (e.g., an underground vault) and monitoring device 33B is located separate from a power delivery node (e.g., anywhere along power lines 24).

Monitoring devices 33 include sensors that generate sensor data indicative of the operating or electrical characteristics of one or more electrical cables 32 and/or cable accessories 34. Sensors of monitoring devices 33 may include temperature sensors (e.g., internal and/or external to the cable accessory), partial discharge sensors, voltage sensors, and/or current sensors, among others. Sensors of monitoring devices 33 may be assigned to a particular electrical phase. For example, a sensor may be assigned to a particular electrical phase by being plugged in to a particular socket associated with the particular electrical phase. For example, a socket may be color coded or labeled to associate the socket with an electrical phase. Monitoring device 33 may include a plurality of sockets associated with a particular power line. For example, monitoring device 33A may include three sockets that are configured to couple to a single type of sensor (e.g., current sensor), where each sensor is configured monitor a respective electrical cable 32A of the same three-phase power line 24A, and three additional sockets configured to couple to additional sensors (e.g., of the same type) that are each monitoring a respective electrical cable of electrical cables 32B of power line 24B.

Example details of monitoring devices are described in U.S. Provisional Patent Application 62/729,325, entitled "ELECTRICAL POWER CABLE MONITORING DEVICE USING LOW SIDE ELECTRODE AND EARTH GROUND SEPARATION," filed Sep. 10, 2018, which is hereby incorporated by reference in its entirety. Examples details of an electrical equipment monitoring system are described in U.S. Provisional Patent Application 62/729, 367, entitled "ELECTRICAL POWER CABLE MANAGEMENT SYSTEM HAVING ANALYTICS ENGINE WITH INTEGRATED MONITORING, ALERTING, AND PRE-FAULT EVENT PREDICTION," filed Sep. 10, 2018, which is hereby incorporated by reference in its entirety.

Monitoring devices 33 each include a power source or receives power from a power source. For example, monitoring devices 33 may each include a battery. As another example, monitoring devices 33 may include a power harvesting device configured to harvest power from power lines 24. For example, the power harvesting device of monitoring devices 33 may receive power via the electrical power carried by power lines 24, via a magnetic field produced by power lines 24, or via heat within power lines 24, cable accessories 34, or other device that generates heat when coupled to power lines 24.

In general, monitoring devices 33 may be communicatively coupled to EEMS 6. In some examples, monitoring devices 33 may include a transceiver to communicate (e.g. via network 4) with EEMS 6. In some examples, monitoring devices 33 communicate with EEMS 6 via gateways 28. As another example, monitoring devices 33 may include wireless communication devices, such as WiFi®, Bluetooth®, or RFID devices, which may be read by a mobile device reader (e.g., a vehicle that includes a reader to communicate with monitoring device 33 as a vehicle drives around environment 8).

In some examples, monitoring devices 33 may receive data from EEMS 6, gateways 28, cable accessories 34, and/or other monitoring devices 33. For example, EEMS 6 may transmit requests for sensor data, firmware updates, or other data to monitoring devices 33.

Monitoring devices 33 may communicate event data indicative of electrical cables 32 and/or cable accessories 34. For example, the event data may include data indicative of the sensor data generated by sensors of the electrical equipment 20, device data for electrical equipment 20, analysis data, or a combination therein. For instance, data indicative of the sensor data may include at least a portion of the sensor data generated by one or more sensors of monitoring devices 33, a summary of the sensor data, conclusions or results of analyses performed on the sensor data, or a combination therein.

Event data may also include device data for electrical equipment 20. Examples of device data (also referred to as equipment data) include identification data (e.g., a unique identifier corresponding to a particular article of electrical equipment 20), device type (e.g., transformer, joint, termination joint, etc.), an event timestamp, location data (e.g., GPS coordinates of the particular article of electrical equipment 20), manufacturing data (e.g., manufacturer, lot number, serial number, date of manufacture, etc.), installation data (e.g., date of installation, identity of an installer or installation team), consumer data (e.g., data identifying a quantity and/or type of consumers serviced by the line, addresses served by the line, and the like), power distribution data (e.g., a type of line, such as ultra-high voltage, high voltage, medium voltage, etc.), or a combination therein.

In some examples, the event data includes analysis data, such as data indicating whether the electrical equipment is predicted to fail (e.g., whether a failure event is predicted to occur) or a predicted or estimated remaining lifespan of the electrical equipment. The analysis data may include data indicating whether a sensor is installed correctly, data associating one or more sensors with a particular electrical cable 32, and/or data associating a group of electrical cables (e.g., electrical cables 32A) with one another as part of a particular power line (e.g., power line 24A).

As described herein, EEMS 6 integrates an event processing platform configured to process hundreds, thousands, or even millions of concurrent streams of events from monitoring devices 33 that monitor respective articles of electrical equipment 20 (e.g., electrical cables 32 and/or cable accessories 34). EEMS 6 integrates comprehensive tools for managing electrical equipment 20 with an underlying diagnostic engine and communication system to provide data acquisition, monitoring, activity logging, reporting, and alert generation. Moreover, EEMS 6 provides a communication system for operation and utilization by and between the various elements of system 2.

Users 18 of computing devices 16 may access EEMS 6 to view results on any analytics performed by EEMS 6 on data acquired from monitoring devices 33. For example, users 18 may review event data acquired and stored by EEMS 6. In addition, users 18 may interact with EEMS 6 to perform asset tracking and to schedule maintenance or replacement for individual pieces of electrical equipment 20, e.g., monitoring devices 33, cables 32 and/or cable accessories 34. EEMS 6 may allow users 18 to create and complete digital checklists with respect to the maintenance and/or replacement procedures and to synchronize any results of the procedures from computing devices 16 to EEMS 6. In some examples, EEMS 6 may present a web-based interface via a web server (e.g., an HTTP server) or client-side applications may be deployed for computing devices 16 used by users 18.

In some examples, EEMS 6 may provide a database query engine for directly querying EEMS 6 to view acquired event data (e.g., sensor data) and any results of the diagnostic engine, e.g., by the way of dashboards, alert notifications, reports and the like. That is, users 18, or software executing on computing devices 16, may submit queries to EEMS 6 and receive data corresponding to the queries for presentation in the form of one or more reports or dashboards. Such dashboards may provide various insights regarding system 2, such as whether sensors of monitoring device 33 are installed correctly, data (e.g., a graphical user interface or GUI) associating one or more sensors with a particular electrical cable 32, and/or data associating a group of electrical cables (e.g., electrical cables 32A) with one another as part of a particular power line (e.g., power line 24A).

In accordance with techniques of this disclosure, EEMS 6 diagnoses and self-heals (or corrects) errors in the installation and/or configuration of electrical equipment 20. In one example, EEMS 6 determines whether the sensors of monitoring devices 33 are installed correctly. Sensors of monitoring device 33 may be installed incorrectly by being installed in the wrong orientation (e.g., backwards), by being installed on an electrical cable that is assigned to an electrical phase different than the electrical phase assigned to the sensor, by being installed on an electrical cable of a power line different than the power line to which the sensor is assigned, or by being calibrated incorrectly.

EEMS 6 may determine whether a sensor is installed correctly by determining whether the sensor is oriented in an expected orientation. In other words, EEMS 6 may determine whether the sensor is installed backwards (e.g., with a reverse polarity). In some instances, EEMS 6 determines whether a sensor is installed correctly by determining whether the sensor is installed on an electrical cable that is assigned to an electrical phase different than the electrical phase assigned to the sensor. In other words, EEMS 6 may determine whether a phase assigned to the sensor corresponds to (e.g., is the same as) a phase assigned to the electrical cable 32 to which the sensor is installed, coupled, or attached. In some examples, EEMS 6 determines whether the sensor is installed correctly by determining whether the sensor is installed on an electrical cable of a power line different than the power line to which the sensor is assigned. In other words, EEMS 6 may determine whether the sensor is installed on the power line 24 to which the sensor is assigned.

According to some examples, EEMS 6 determines whether sensors of monitoring devices 33 are installed correctly based at least in part on event data (e.g., sensor data) received from monitoring devices 33. In one example, the sensor data indicates the amplitude of a current or a voltage of a particular electrical cable. EEMS 6 determines, based on the sensor data, a zero-crossing sequence for the voltage on a plurality of electrical cables 32, a zero-crossing sequence for the current on a plurality of electrical cables 32, or both. That is, EEMS 6 may determine a zero-crossing sequence for the voltage and/or current based on sensors installed or coupled to a plurality of electrical cables (e.g., electrical cables 32A). In some instances, EEMS 6 determines a polarity or direction of each zero-crossing event in the zero-crossing sequence. That is, EEMS 6 determines whether the voltage or current passed from negative-to-positive or positive-to-negative for each zero-crossing event in the zero-crossing sequence.

EEMS 6 determines, in some scenarios, whether sensors are installed correctly based at least in part on the zero-crossing sequence and the polarity of each zero-crossing event. As one example, EEMS 6 determines whether the zero-crossing sequence corresponds to (e.g., matches) an expected zero-crossing sequence. In one instance, the expected zero-crossing sequence is based on the number of phases of power lines 24. For instance, the expected phase difference between zero-crossing equals 360 degrees divided by the twice the number of phases, as illustrated in Equation 1.

$$\text{Phase Difference} = \frac{360}{2*N}, \quad \text{Equation 1}$$

where N equals the number of phases.

For example, in a 3-phase system, the expected phase difference between zero-crossings is 60 degrees. In other words, in the 3-phase example, the expected zero-crossing sequence includes a zero-crossing event every 60 degrees. In one example, the expected polarity of each zero-crossing event includes a positive-to-negative event followed by a negative-to-positive event, with a positive-to-negative zero-crossing event occurring every 120 degrees and a negative-to-positive zero crossing event occurring every 120 degrees, as further illustrated in FIG. 5.

In some instances, EEMS 6 determines that the sensors of monitoring devices 33 are installed correctly in response to determining that the actual zero-crossing sequence corresponds to (e.g., matches) the expected zero-crossing sequence and that the polarity or direction of each zero-crossing event in the zero-crossing sequence corresponds to the expected polarity of each respective zero-crossing event.

EEMS 6 may determine that the sensors of monitoring devices 33 are not installed correctly in response to determining that the actual zero-crossing sequence does not correspond to the expected zero-crossing sequence or that the polarity of one or more zero-crossing events in the zero-crossing sequence do not correspond to the expected polarity of each respective zero-crossing event. For example, when the actual zero-crossing sequence does not correspond to the expected zero-crossing sequence (e.g., the phase difference between two zero-crossing events does not equal the expected phase difference), this may indicate that one or more of the sensors are installed on the wrong electrical cable. In other words, EEMS 6 may determine that one of the sensors is assigned to one electrical phase (e.g., phase A) but is installed on an electrical cable assigned to a different electrical phase (e.g., phase B). In one example, when the polarity of one or more zero-crossing events does not correspond to the expected polarity of the zero-crossing event, this may indicate that one or more of the sensors are installed with the wrong orientation. In other words, EEMS 6 may determine that one of the sensors is installed backwards.

According to some scenarios, EEMS 6 determines a plurality of candidate solution sets to the erroneous installation in response to determining that one or more of the sensors of monitoring devices 33 are not installed correctly. The plurality of candidate solution sets may include a plurality of candidate sensor assignment sets, a plurality of candidate sensor orientation sets, or both. In one scenario, EEMS 6 determines the set of candidate solutions by determining various combinations (e.g., all candidate combinations) of sensor orientations and/or phase assignments. In other words, EEMS 6 determines a plurality of candidate solution sets, each candidate solution set indicating a unique combination of sensor orientations and/or phase assignments.

In one example, each candidate solution set represents a unique combination of sensors and phase assignment for the respective sensors. For example, in a three-phase system (phases A, B, and C) with three sensors of a given type (e.g., current sensors), EEMS 6 may determine the three current sensors can be assigned to the three phases in six different combinations. That is, in such examples, EEMS 6 may determine the plurality of candidate solution sets include six different solution sets.

EEMS 6 may determine a solution score for each candidate solution set, the solution score indicating a probability that the respective candidate solution set will correct the installation error. In some examples, EEMS 6 determines the solution score based at least in part on reference data indicative of a reference zero-crossing sequence, and/or the polarity of each zero-crossing event in the reference zero-crossing sequence. The reference data may be indicative of the zero-crossing sequence monitored by another monitoring system (e.g., monitoring system 33B) and/or a central management system (e.g., measured by sensors at the power source, such as a power plant). In one example, EEMS 6 compares the zero-crossing sequence for each of the candidate solution sets to reference zero-crossing sequence to determine respective scores. For example, EEMS 6 may assign a relatively high solution score (e.g., 95 out of 100) to a combination with a zero-crossing sequence that closely corresponds to the reference zero-crossing sequence, and may assign a low solution score (e.g., 20 out of 100) to a combination with a zero-crossing sequence that does not correspond to the reference zero-crossing sequence.

According to some examples of the present disclosure, EEMS 6 determines or assigns the solution score for each candidate solution set based at least in part on a fingerprint for one or more electrical cables. The fingerprint may include data indicative of electrical characteristics or attributes of the one or more electrical cables. In other words, the fingerprint may include data indicative of unique recurring or sporadic attributes that are common within a multi-phase system. Example electrical characteristics include the voltage and/or current amplitude, frequency offsets (e.g., minute frequency offsets), harmonic distortion patterns, voltage amplitude offsets (e.g., minute voltage amplitude offsets), system current imbalance, among other characteristics. EEMS 6 may compare the fingerprint for a set of electrical cables to a reference fingerprint. For example, the reference fingerprint may include the electrical characteristics of known set of electrical cables (e.g., at the power source). In some instances, EEMS 6 determines the solution scores based on a similarity between the reference fingerprint and the fingerprint for candidate solution set. For instance, EEMS 6 may assign a relatively high solution score to a group of sensors that detect similar characteristics of electrical cables as the characteristics of the reference fingerprint and may assign a relatively low solution score to a group of sensors that detect dissimilar characteristics relative to the electrical characteristics of the reference fingerprint.

In some examples, EEMS 6 determines whether any of the candidate solution sets will correct the installation error. For example, EEMS 6 may determine whether any of the candidate solutions will correct the installation error by determining whether the zero-crossing sequence of the highest scoring solution corresponds to the reference zero-crossing sequence. EEMS 6 may determine that none of the solutions will correct the installation error in response to determining that zero-crossing sequence of the highest scoring candidate solution set does not correspond to the reference zero-crossing sequence.

EEMS 6 performs one or more actions in response to determining that none of the solutions will correct the installation error. For example, EEMS 6 may output a notification (e.g., a text message, an email, an application alert, etc.) to one or more computing devices 16 indicating an installation error. In some examples, the notification indicates that one of users 18 should manually inspect the cables and sensors. The notification may indicate one or more candidate solution sets, such as the candidate solution set with the highest solution score.

In some scenarios, EEMS 6 determines that one of the candidate solutions sets will correct the error. In such scenarios, EEMS 6 may determine whether the solution can be implemented automatically. In other words, EEMS 6 may determine whether it can self-heal the error.

In some examples, EEMS 6 determines that one of the candidate solution sets that will correct the error includes performing a self-healing operation to reconfigure at least one component of the electrical power grid. In other words, EEMS 6 may determine that the candidate solution set may be implemented automatically. Examples of self-healing operations include re-assigning one or more sensors to a different phase and/or re-assigning one or more sensors to a different polarity. For example, a sensor currently assigned electrical phase-A may have been installed on an electrical cable 32B assigned to electrical phase-B and another sensor assigned to electrical phase-B may have been installed on an electrical cable 32A assigned to electrical phase-A. In such examples, EEMS 6 automatically corrects, or self-heals, the installation error by re-assigning the sensor installed on electrical cable 32B to phase-B and the sensor installed on electrical cable 32A to phase-A. In another example, EEMS 6 automatically corrects a polarity installation error (e.g., a current sensor installed backwards) by adjusting the phase of one or more sensors (e.g., adding or subtracting 180-degrees phase shift).

In another example, EEMS 6 determines the solution cannot be implemented automatically (e.g., the solution requires manual intervention). For example, EEMS 6 may determine the candidate solution set having the highest solution score includes attaching the sensor to a different electrical cable (e.g., if two sensors of the same type are installed on the same electrical cable). In one example, EEMS 6 may output a notification (e.g., a text message, an email, an application alert, etc.) to one or more computing devices 16 indicating an installation error. In some examples, the notification indicates the solution. In one example, EEMS 6 schedules a maintenance call (also referred to as a service call) to re-install the sensor in response to determining the solution cannot be implemented manually.

According to some techniques of this disclosure, EEMS 6 associates a first set of electrical cables 32 with a second set of electrical cables 32 based at least in part on the fingerprints associated with each set of electrical cables. In some example, EEMS 6 associates a sensor installed on electrical cable $32A_1$ with a sensor installed on electrical cable $32C_1$ based on the fingerprints for each of the electrical cables. In such examples, EEMS 6 determines that electrical cable $32A_1$ is electrically coupled to electrical cable $32C_1$. In this way, EEMS 6 may map electrical cables 32A and electrical cables 32C to one another.

EEMS 6 utilizes, in some examples, the fingerprints for individual electrical cables 32 or power lines 24 to determine whether a set of sensors is installed correctly. For example, EEMS 6 compares a fingerprint of a first set of sensors attached or installed on electrical cables 32A to a fingerprint of a second set of sensors installed on different electrical cables to determine whether the second set of sensors is installed on electrical cables 32C. In one example, EEMS 6 determines that the second set of sensors are not installed correctly (e.g., are not installed at electrical cables 32C) in response to determining that the fingerprint of the first set of sensors does not correspond to (e.g., does not match) the fingerprint of the second set of sensors. In such examples, EEMS 6 may determine a plurality of candidate solution sets, automatically implement a solution, output a notification of a solution, schedule a service call, etc.

In another example, EEMS 6 determines that the second set of sensors are installed correctly in response to determining the fingerprint of the first set of sensors correspond to the fingerprint of the second set of sensors. In these examples, EEMS 6 may map one set of electrical cables 32A to another set of electrical cables 32C to indicate that the physical cables are electrically coupled to one another (e.g.,
cables 32A and 32C form the same electrical line, such that the voltage and current on cables 32A and 32C have the same electrical phase).

While EEMS 6 is described diagnosing and correcting installation and configuration errors, in some examples, gateways 28 and/or monitoring devices 33 may perform some or all of the functionality of EEMS 6. For example, monitoring devices 33 may analyze sensor data generated by sensors of one or more monitoring devices 33. Monitoring devices 33 may output (e.g., via gateways 28) conclusions, assertions, or results of the analysis to EEMS 6. Similarly, gateways 28 may receive data from a plurality of monitoring devices 33, analyze the data, and send messages to EEMS 6 and/or one or more monitoring devices 33. For example, monitoring devices 33 and/or gateways 28 may output data (e.g., to EEMS 6 and/or computing devices 16) indicating whether one or more sensors are installed correctly, data associating a group of sensors with one another, data associating one or more sensors with a particular electrical cable 32 and/or a particular power line 24.

Figure 2:
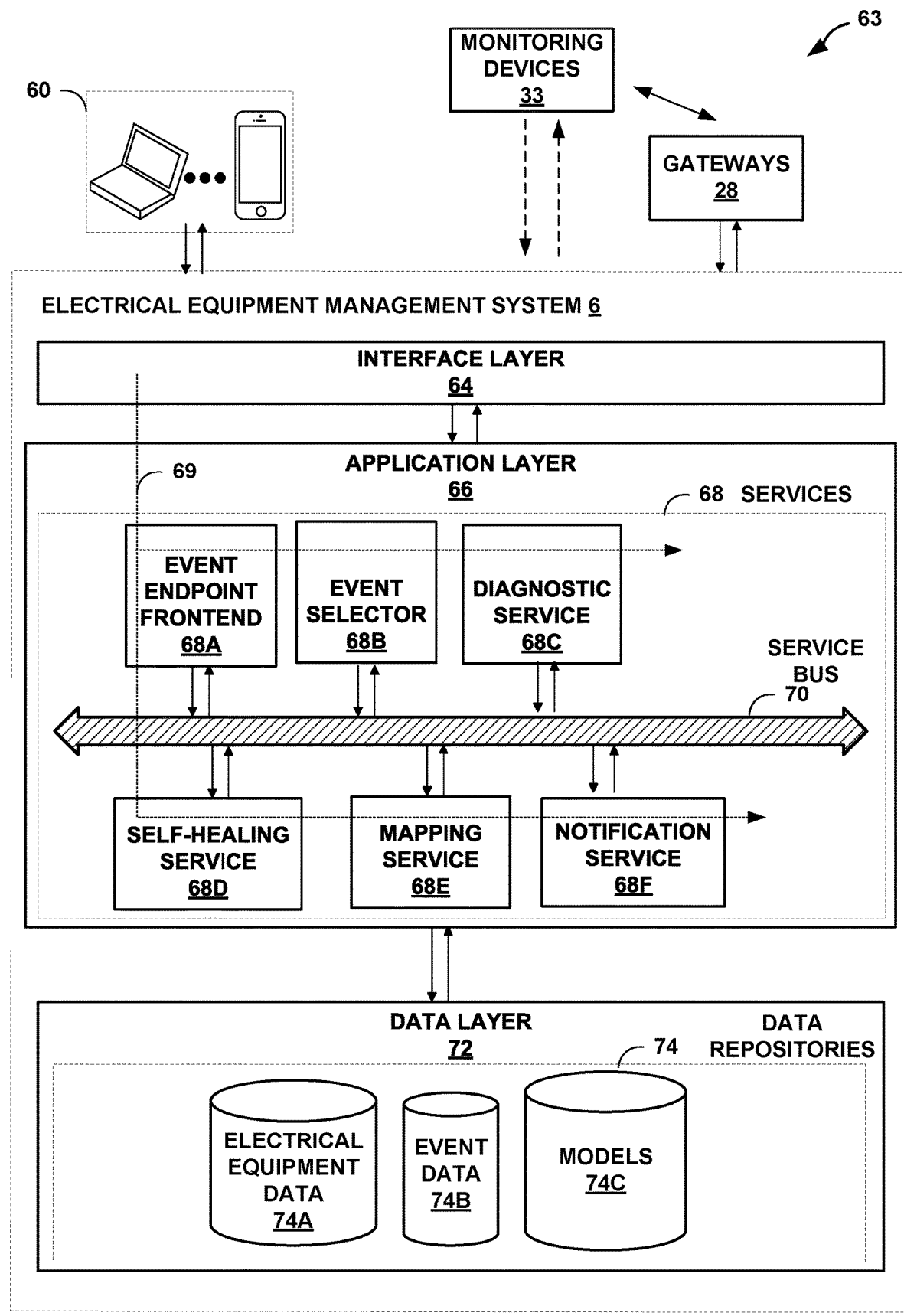
FIG. 2 is a block diagram illustrating an operating perspective of the electrical equipment management system shown in FIG. 1, in accordance with various techniques of this disclosure.

FIG. 2 is a block diagram providing an operating perspective of EEMS 6 when hosted as cloud-based platform capable of supporting multiple, distinct environments 8 each having a plurality of articles of electrical equipment 20. In the example of FIG. 2, the components of EEMS 6 are arranged according to multiple logical layers that implement the techniques of the disclosure. Each layer may be implemented by one or more modules comprised of hardware, software, or a combination of hardware and software.

In FIG. 2, monitoring devices 33, either directly or by way of or gateways 28, as well as computing devices 60, operate as clients 63 that communicate with EEMS 6 via interface layer 64. Computing devices 60 typically execute client software applications, such as desktop applications, mobile applications, and web applications. Computing devices 60 may represent any of computing devices 16 of FIG. 1. Examples of computing devices 60 may include, but are not limited to, a portable or mobile computing device (e.g., smartphone, wearable computing device, tablet), laptop computers, desktop computers, smart television platforms, and servers, to name only a few examples.

As further described in this disclosure, monitoring devices 33 communicate with EEMS 6 to provide streams of data acquired from embedded sensors and other monitoring circuitry and receive from EEMS 6 alerts, configuration data, and other communications. Client applications executing on computing devices 60 may communicate with EEMS 6 to send and receive data that is retrieved, stored, generated, and/or otherwise processed by services 68A-68E (collectively, services 68). For instance, the client applications may request and edit event data stored at and/or managed by EEMS 6. In some examples, the client applications may request and display aggregate event data that summarizes or otherwise aggregates data acquired from monitoring devices 33 and/or generated by EEMS 6. In some examples, the client applications may output (e.g., for display) data received from EEMS 6 to visualize such data for users of clients 63. As further illustrated and described in below, EEMS 6 may provide data to the client applications, which the client applications output for display in user interfaces.

Clients applications executing on computing devices 60 may be implemented for different platforms but include similar or the same functionality. For instance, a client application may be a desktop application compiled to run on a desktop operating system, or may be a mobile application compiled to run on a mobile operating system. As another example, a client application may be a web application such as a web browser that displays web pages received from EEMS 6. In the example of a web application, EEMS 6 may receive requests from the web application (e.g., the web browser), process the requests, and send one or more responses back to the web application. In this way, the collection of web pages, the client-side processing web application, and the server-side processing performed by EEMS 6 collectively provides the functionality to perform techniques of this disclosure. In this way, client applications use various services of EEMS 6 in accordance with techniques of this disclosure, and the applications may operate within various different computing environment (e.g., embedded circuitry or processor of a desktop operating system, mobile operating system, or web browser, to name only a few examples).

As shown in FIG. 2, EEMS 6 includes an interface layer 64 that represents a set of application programming interfaces (API) or protocol interface presented and supported by EEMS 6. Interface layer 64 initially receives messages from any of clients 63 for further processing at EEMS 6. Interface layer 64 may therefore provide one or more interfaces that are available to client applications executing on clients 63. In some examples, the interfaces may be APIs that are accessible over a network. Interface layer 64 may be implemented with one or more web servers. The one or more web servers may receive incoming requests, process and/or forward data from the requests to services 68, and provide one or more responses, based on data received from services 68, to the client application that initially sent the request. In some examples, the one or more web servers that implement interface layer 64 may include a runtime environment to deploy program logic that provides the one or more interfaces. As further described below, each service may provide a group of one or more interfaces that are accessible via interface layer 64.

In some examples, interface layer 64 may provide Representational State Transfer (RESTful) interfaces that use HTTP methods to interact with services and manipulate resources of EEMS 6. In such examples, services 68 may generate JavaScript Object Notation (JSON) messages that interface layer 64 sends back to the client application that submitted the initial request. In some examples, interface layer 64 provides web services using Simple Object Access Protocol (SOAP) to process requests from client applications. In still other examples, interface layer 64 may use Remote Procedure Calls (RPC) to process requests from clients 63. Upon receiving a request from a client application to use one or more services 68, interface layer 64 sends the data to application layer 66, which includes services 68.

Data layer 72 of EEMS 6 represents a data repository that provides persistence for data in EEMS 6 using one or more data repositories 74. A data repository, generally, may be any data structure or software that stores and/or manages data. Examples of data repositories include but are not limited to relational databases, multi-dimensional databases, maps, and hash tables, to name only a few examples. Data layer 72 may be implemented using Relational Database Management System (RDBMS) software to manage data in data repositories 74. The RDBMS software may manage one or more data repositories 74, which may be accessed using Structured Query Language (SQL). Data in the one or more databases may be stored, retrieved, and modified using the RDBMS software. In some examples, data layer 72 may be implemented using an Object Database Management System (ODBMS), Online Analytical Processing (OLAP) database or other suitable data management system.

Electrical equipment data 74A of data repositories 74 may include data corresponding to a plurality of articles of electrical equipment, such as monitoring devices 33. In some examples, electrical equipment data 74A may include device or equipment data, manufacturing data, installation data, consumer data, power distribution data, among others. For example, electrical equipment data 74A may include, for each monitoring device 33, data identifying a date of manufacture, a date of installation, a location (e.g., GPS coordinates, street address, etc.), entity that installed the monitoring device, a unique identifier (e.g., serial number), a type of monitoring device, etc. For example, prior to installing monitoring devices 33, an installer may scan (e.g., with one of computing devices 16, such as a mobile phone) a barcode on monitoring device 33A that includes device data representing a unique identifier, date of manufacture, and so forth, and may upload the device data to EEMS 6. In some instances, the mobile device may append data such as the current date as the date of installation and GPS coordinates to the device data, and may send the device data to EEMS 6, such that EEMS 6 may store the device data for monitoring device 33A in electrical equipment data 74A.

As shown in FIG. 2, each of services 68 is implemented in a modular form within EEMS 6. Although shown as separate modules for each service, in some examples the functionality of two or more services may be combined into a single module or component. Each of services 68 may be implemented in software, hardware, or a combination of hardware and software. Moreover, services 68 may be implemented as standalone devices, separate virtual machines or containers, processes, threads or software instructions generally for execution on one or more physical processors. In some examples, one or more of services 68 may each provide one or more interfaces that are exposed through interface layer 64. Accordingly, client applications of computing devices 60 may call one or more interfaces of one or more of services 68 to perform techniques of this disclosure.

Event endpoint frontend 68A operates as a front-end interface for receiving and sending communications to monitoring devices 33. In other words, event endpoint frontend 68A operates as a frontline interface to monitoring devices 33 deployed within environments 8 of FIG. 1. In some instances, event endpoint frontend 68A may be implemented as a plurality of tasks or jobs spawned to receive individual inbound communications of event streams 69 from the monitoring devices 33 carrying data sensed and captured by sensors of the monitoring devices 33. When receiving event streams 69, for example, event endpoint frontend 68A may spawn tasks to quickly enqueue an inbound communication, referred to as an event, and close the communication session, thereby providing high-speed processing and scalability. Each incoming communication may, for example, carry recently captured data representing sensed conditions from monitoring devices 33. Communications exchanged between the event endpoint frontend 68A and the monitoring devices 33 may be real-time or pseudo real-time depending on communication delays and continuity.

In general, event processor 68B operates on the incoming streams of events to update event data 74B within data repositories 74. In general, event data 74B may include all or a subset of data generated by monitoring devices 33. For example, in some instances, event data 74B may include entire streams of data obtained from monitoring devices 33. In other instances, event data 74B may include a subset of such data, e.g., associated with a particular time period. As another example, event data 74B may include analysis data indicating results of analysis of sensor data performed by one or more of monitoring devices 33 or gateways 28. Event processor 68B may create, read, update, and delete event data stored in event data 74B.

In accordance with techniques of this disclosure, EEMS 6 diagnoses and, optionally, self-heals or corrects errors in the installation and/or configuration of electrical equipment 20. In some examples, diagnostic service 68C determines whether the current in electrical cables 32A of power line 24A lags the voltage or whether the current leads the voltage. In one example, diagnostic service 68C assigns the current as the primary reference characteristic and assigns voltage as the secondary reference characteristic in response to determining that current leads voltage (or that voltage measurements are not available). In another example, if the voltage leads the current, diagnostic service 68C assigns the voltage as the primary reference characteristic and assigns voltage as the secondary reference characteristic.

Diagnostic service 68C of EEMS 6 determines whether the sensors of monitoring devices 33 are installed correctly. Sensors of monitoring device 33 may be installed incorrectly by being installed in the wrong orientation (e.g., backwards), by being installed on an electrical cable that is assigned to an electrical phase different than the electrical phase assigned to the sensor, by being installed on an electrical cable of a power line different than the power line to which the sensor is assigned, or by being calibrated incorrectly.

According to some examples, diagnostic service 68C determines whether sensors of monitoring devices 33 are installed correctly based at least in part on event data (e.g., sensor data) received from monitoring devices 33. Diagnostic service 68C determines a zero-crossing sequence for the voltage on a plurality of electrical cables 32, a zero-crossing sequence for the current on a plurality of electrical cables 32, or both, based on the event data. That is, diagnostic service 68C may determine a zero-crossing sequence for the voltage and/or current based data from sensors installed or coupled to a plurality of electrical cables (e.g., electrical cables 32A). In some instances, diagnostic service 68C determines a polarity or direction of each zero-crossing event in the zero-crossing sequence. In other words, diagnostic service 68C determines whether the voltage or current passed from negative-to-positive or positive-to-negative for each zero-crossing event in the zero-crossing sequence.

In one example, diagnostic service 68C determines whether sensors of monitoring device 33 are installed correctly by determining whether each sensor is installed on an electrical cable that is assigned to an electrical phase different than the electrical phase assigned to the sensor. In other words, diagnostic service 68C determines whether the phase assigned to a given sensor is the same as the phase of the electrical cable to which the sensor is attached or otherwise configured to monitor. Diagnostic service 68C compares the zero-crossing sequence for the primary reference characteristic to a reference zero-crossing sequence. The reference zero-crossing sequence may be zero-crossing sequence measured at an external location, such as at a source of the power. In some scenarios, diagnostic service 68C compares the zero-crossing sequence for the primary reference characteristic to the zero-crossing sequence for the secondary reference characteristic. In one example, diagnostic service 68C determines the sensors of monitoring device 33A are installed correctly in response to determining that the zero-crossing sequence for the primary reference characteristic matches the reference zero-crossing sequence and that the zero-crossing sequence for the primary reference characteristic matches the zero-crossing sequence for the secondary reference characteristic. That is, in such examples, diagnostic service 68C determines that the given sensor is installed correctly because the phase assigned to the given sensor is the same as the phase of the electrical cable to which the given sensor is attached.

In some instances, diagnostic service 68C determines the sensors of monitoring device 33A are not installed correctly in response to determining that the zero-crossing sequence for the primary reference characteristic does not match the reference zero-crossing sequence or that the zero-crossing sequence for the primary reference characteristic does not match the zero-crossing sequence for the secondary reference characteristic. In other words, in such instances, diagnostic service 68C determines that a given sensor is not installed correctly because the phase assigned to the given sensor is not the same as the phase of the electrical cable to which the given sensor is attached or otherwise configured to monitor.

Self-healing service 68D determines a first plurality of candidate solution sets to the erroneous installation in response to determining that one or more of sensors are installed on an electrical cable that is assigned to an electrical phase different than the electrical phase assigned to the sensor. In some examples, the first plurality of candidate solution sets are associated with phase assignments for sensors of a single power line, such as power line 24A. In one scenario, self-healing service 68D determines the first plurality of candidate solution sets by determining various combinations (e.g., all candidate combinations) of phase assignments for the sensors of monitoring devices 33. In other words, self-healing service 68D determines a first plurality of candidate solution sets, each candidate solution set of the first plurality of candidate solution sets indicating a unique combination of phase assignments for each of the sensors on a given power line 24. An example of the first plurality of candidate solution sets for power line 24A is illustrated in table 1.

TABLE 1

| Candidate | Phase assigned to each electrical cable: | | |
| Solution Set | Cable 32A | Cable 32B | Cable 32C |
| --- | --- | --- | --- |
| Set #1 | A | B | C |
| Set #2 | A | C | B |
| Set #3 | B | A | C |
| Set #4 | B | C | A |
| Set #5 | C | A | B |
| Set #6 | C | B | A |

Self-healing service 68D may determine a solution score for each candidate solution set in the first plurality of candidate solution sets. Each solution score indicates a probability that the respective candidate solution set will correct the installation error. In some examples, self-healing service 68D determines the solution score based at least in part on the reference zero-crossing sequence, the zero-crossing sequence of the primary reference characteristic (e.g., current), and the zero-crossing sequence of the secondary reference characteristic (e.g., voltage).

Self-healing service 68D determines whether any of the candidate solution sets will correct the installation error. In one example, self-healing service 68D determines a prospective zero-crossing sequence that would exist for the primary reference characteristics (e.g., current zero-crossing sequence) and the secondary reference characteristic (e.g., voltage zero-crossing sequence) if the sensors were assigned according to the assignments of the highest scoring candidate solution set. In such examples, self-healing service 68D may determine that the highest scoring candidate solution set corrects the installation error in response to determining that the prospective zero-crossing sequence of the primary reference characteristic (e.g., current) matches the reference zero-crossing sequence and the prospective zero-crossing sequence of the secondary reference characteristic (e.g., voltage). In such examples, self-healing service 68D may perform an action by re-assigning the sensor to a phase associated with the electrical cable to which the sensor is installed based on the sensor-phase assignments indicated by the highest-scoring candidate solution set.

In another example, self-healing service 68D may determine that none of the candidate solution sets of the first plurality of candidate solution sets will correct the installation error in response to the zero-crossing sequence of the primary reference characteristic does not match the reference zero-crossing sequence and/or does not match the zero-crossing sequence of the secondary reference characteristic.

In one example, self-healing service 68D determines a second plurality of candidate solution sets in response to determining that none of the first set of candidate solutions correct the installation error. In some examples, the second plurality of candidate solution sets are associated with phase assignments for sensors of a plurality of power lines monitored by the same monitoring device, such as sensors of monitoring device 33A that monitor power lines 24A and 24B. For instance, if none of the first set of candidate solutions will correct the phase assignment error, this may indicate that a sensor assigned to power line 24A is actually installed on an electrical cable of power line 24B. In such instances, self-healing service 68D determines a second set of candidate solutions by simulating the phase assignments for all of the sensors attached to power lines 24A and 24B to determine possible combinations of sensors and electrical cables 32A, 32B of power lines 24A, 24B. Self-healing service 68D may score each candidate solution set of the second plurality of candidate solution sets.

In one scenario, self-healing service 68D determines whether any of the candidate solution sets in the second plurality of solution sets resolves the installation error. In one example, self-healing service 68D determines whether the highest scoring candidate solution set of the second plurality of candidate solution sets resolves the installation error. For example, self-healing service 68D may determine a prospective zero-crossing sequence that would exist for the primary reference characteristics (e.g., current zero-crossing sequence) and the secondary reference characteristic (e.g., voltage zero-crossing sequence) if the sensors were assigned according to the assignments of the highest scoring candidate solution set.

Self-healing service 68D determines, in some examples, that the highest scoring solution set does not resolve the installation error in response to determining that the prospective zero-crossing sequence of the primary reference characteristic does not match the reference zero-crossing sequence and the prospective zero-crossing sequence of the secondary reference characteristic. In such examples, EEMS 6 performs one or more actions in response to determining that none of the candidate solution sets in the second plurality of candidate solutions sets resolve the installation error. In one example, notification service 68F performs an action by outputting a notification indicative of the installation error to another computing device. In another example, notification service 68F performs an action by schedules a service call.

Self-healing service 68D determines, in some examples, that the candidate solution set with the highest score resolves the discrepancy in response to determining that the zero-crossing sequence of the primary reference characteristic matches the reference zero-crossing sequence and the zero-crossing sequence of the secondary reference characteristic. In such examples, self-healing service 68D may re-assign the sensor to a phase associated with the electrical cable to which the sensor is installed based on the sensor-phase assignments indicated by the highest-scoring candidate solution set.

According to some examples, diagnostic service 68C determines whether one or more sensors of monitoring device 33 are installed correctly by determining whether each current sensor is installed in the correct orientation (e.g., rather than being installed backwards). Diagnostic service 68C may determine that the orientation of one or more current sensors is incorrect (e.g., the sensors are installed backward) in response to determining that the polarity of one or more zero-crossing events in the zero-crossing sequence do not correspond to the expected polarity of each respective zero-crossing event.

In one example, diagnostic service 68C determines the orientation of one or more current sensors is correct in response to determining the polarity of one or more zero-crossing events corresponds (e.g., matches) to the expected polarity of the zero-crossing event. In another example, diagnostic service 68C determines the orientation of one or more current sensors is not correct in response to determining the polarity of one or more zero-crossing events does not correspond to the expected polarity of the zero-crossing event. In other words, diagnostic service 68C may determine that one of current sensors is installed backwards.

Self-healing service 68D determines a third plurality of candidate solution sets to the erroneous installation in response to determining that one or more of the sensors of monitoring devices 33 are not oriented correctly. The third plurality of candidate solution sets may include a plurality of candidate sensor orientations. In one scenario, self-healing service 68D determines the third set of candidate solutions by determining various combinations (e.g., all candidate combinations) of sensor orientations. In other words, self-healing service 68D determines a third plurality of candidate solution sets, each candidate solution set indicating a unique combination of sensor orientations.

Self-healing service 68D may determine a solution score for each candidate solution set in the third plurality of candidate solution sets, the solution score indicating a probability that the respective candidate solution set will correct the installation error. In some examples, self-healing service 68D determines the solution score based at least in part on the polarity of each zero-crossing event in the reference zero-crossing sequence and the polarity of each zero-crossing sequence for the current.

Self-healing service 68D determines whether any of the candidate solution sets in the third plurality of candidate solution sets will correct the installation error. Self-healing service 68D may determine the highest scoring candidate solution set corrects the installation error in response to in response to determining that the polarity of each zero-crossing event in a highest scoring solution set matches the polarity of each zero-crossing event in the reference zero-crossing sequence. In such examples, self-healing service

68D may re-assign the orientation or polarity of a current sensor to the polarity indicated by the highest-scoring candidate solution set.

Diagnostic service 68C may determine whether the sensor is installed correctly by determining whether the sensor is calibrated correctly. Diagnostic service 68C determines, in one example, whether the sensor is calibrated correctly by determining whether the amplitude of the current and/or voltage is within an expected range of current or voltage, respectively. In one example, diagnostic service 68C determines that the sensor is not calibrated correctly in response to determining that the current or voltage measured by the sensor is not within the expected range.

Self-healing service 68D may perform an action to re-calibrate the sensors in response to determining that the sensors are not calibrated correctly. For example, self-healing service 68D may recalibrate the gain and conversion coefficients of for the sensor based on a reference current or voltage, such as the current or voltage present at the power source or at another monitoring device 33. In another examples, self-healing service 68D performs the action by outputting a notification, which may for example, include information indicating the calibration error.

According to some techniques of this disclosure, mapping service 68E associates a group of electrical cables 32 with one another based on the electrical characteristics of the electrical cables. In one example, mapping service 68E determines a fingerprint of one or more electrical cables 32 and/or a fingerprint for one or more powerlines 24. The fingerprint may represent the electrical characteristics of a given electrical cable or power line. In one example, mapping service 68E associates electrical cables $32A_1$, $32A_2$, and $32A_3$ with one another based on the fingerprints. For example, mapping service 68E may apply a model 74C to the fingerprints of electrical cables 32A and determine that electrical cables $332A_1$, $32A_2$, and $32A_3$ are part of the same power line 24A. In other words, the model may receive the fingerprints of $32A_1$, $32A_2$, and $32A_3$ as input and output data indicating that electrical cables $32A_1$, $32A_2$, and $32A_3$ are associated with one another as part of the same power line 24A. In this way, mapping service 68E may map different electrical cables 32A to the same power line 24A.

In some examples, models 74C are trained via machine learning. Example machine learning techniques that may be employed to generate models 74C can include various learning styles, such as supervised learning, unsupervised learning, and semi-supervised learning. Example types of algorithms include Bayesian algorithms, Clustering algorithms, decision-tree algorithms, regularization algorithms, regression algorithms, instance-based algorithms, artificial neural network algorithms, deep learning algorithms, dimensionality reduction algorithms and the like. Various examples of specific algorithms include Bayesian Linear Regression, Boosted Decision Tree Regression, and Neural Network Regression, Back Propagation Neural Networks, the Apriori algorithm, K-Means Clustering, k-Nearest Neighbour (kNN), Learning Vector Quantization (LUQ), Self-Organizing Map (SOM), Locally Weighted Learning (LWL), Ridge Regression, Least Absolute Shrinkage and Selection Operator (LASSO), Elastic Net, and Least-Angle Regression (LARS), Principal Component Analysis (PCA) and Principal Component Regression (PCR).

EEMS 6 may initially train models 74C based on a training set of sensor data and, in some examples, on data for indicating whether the sensors are monitoring electrical cables that are part of the same power line. By training a model based on the training set, mapping service 68E may apply the model to the event data and generate higher probabilities or scores that a set of electrical cables are part of the same powerline 24.

In some examples, in addition to mapping a group of electrical cables 32A to a single power line 24A, mapping service 68E may associate or map one power line 24 to another power line. For example, mapping service 68E may determine that power line 24A is coupled to power line 24C (or are actually the same physical power line monitored at different geographic locations). In another example, mapping service 68E determines that a given electrical cable (e.g., cable 32A1) is coupled to another electrical cable (e.g., cable 32C1), or are actually the same physical electrical cable monitored at different geographic locations). In some examples, mapping service 68E maps electrical cables 32 and/or power lines 24 to one another based on the fingerprints of the electrical cables 32 or power lines 24. For example, mapping service 68E may apply one of models 74C to the respective fingerprints for electrical cables 32 and/or power lines 24 to determine whether power line 24A and power line 24C are coupled to one another (or are the same physical cable). In other words, models 74C may receive the fingerprints for a plurality of electrical cables and/or power lines as inputs and may output data indicating whether two electrical cables or power lines are physically coupled (or are actually the same physical component). In another example, models 74C may receive the fingerprints are inputs and may output data indicating which electrical cables and/or power lines are coupled to one another. In this way, mapping service 68E may map or associate various electrical cables 32 and power lines 24 to one another.

In some examples, mapping service 68E outputs data indicative of the mappings. For example, mapping service 68E may output a graphical user interface (e.g., for display at computing devices 60, indicating the mappings between electrical cables 32 and/or power lines 24. In one example, the graphical user interface may include a geographical map, which may indicate the locations of monitoring devices 33 and power lines 24. As one example, the graphical user interface may indicate which electrical cables 32 and/or power lines 24 are associated with one another (e.g., via color coding). In this way, mapping service 68E may enable users of computing devices 60 to visualize the physical infrastructure, which may enable users of computing devices 60 and/or field technicians to trace power lines 24 as power lines 24 traverse a physical environment 8. Thus, users or technicians may more quickly locate and identify power lines 24 from location to location, which may enable the users or technicians to more quickly locate, inspect, and/or repair electrical cables, cable accessories, monitoring devices, or other electrical equipment 20.

In general, while certain techniques or functions are described herein as being performed by certain components, e.g., EEMS 6 or monitoring devices 33, it should be understood that the techniques of this disclosure are not limited in this way. That is, certain techniques described herein may be performed by one or more of the components of the described systems. For example, in some instances, monitoring devices 33 may have a relatively limited sensor set and/or processing power. In such instances, gateway 28 and/or EEMS 6 may be responsible for most or all of the processing of event data, determining the likelihood of a failure event, and the like. In other examples, monitoring devices 33 and/or gateways 28 may have additional sensors, additional processing power, and/or additional memory, allowing such devices to perform additional techniques. Determinations regarding which components are responsible for performing techniques may be based, for example, on processing costs, financial costs, power consumption, or the like.

Figure 3A:
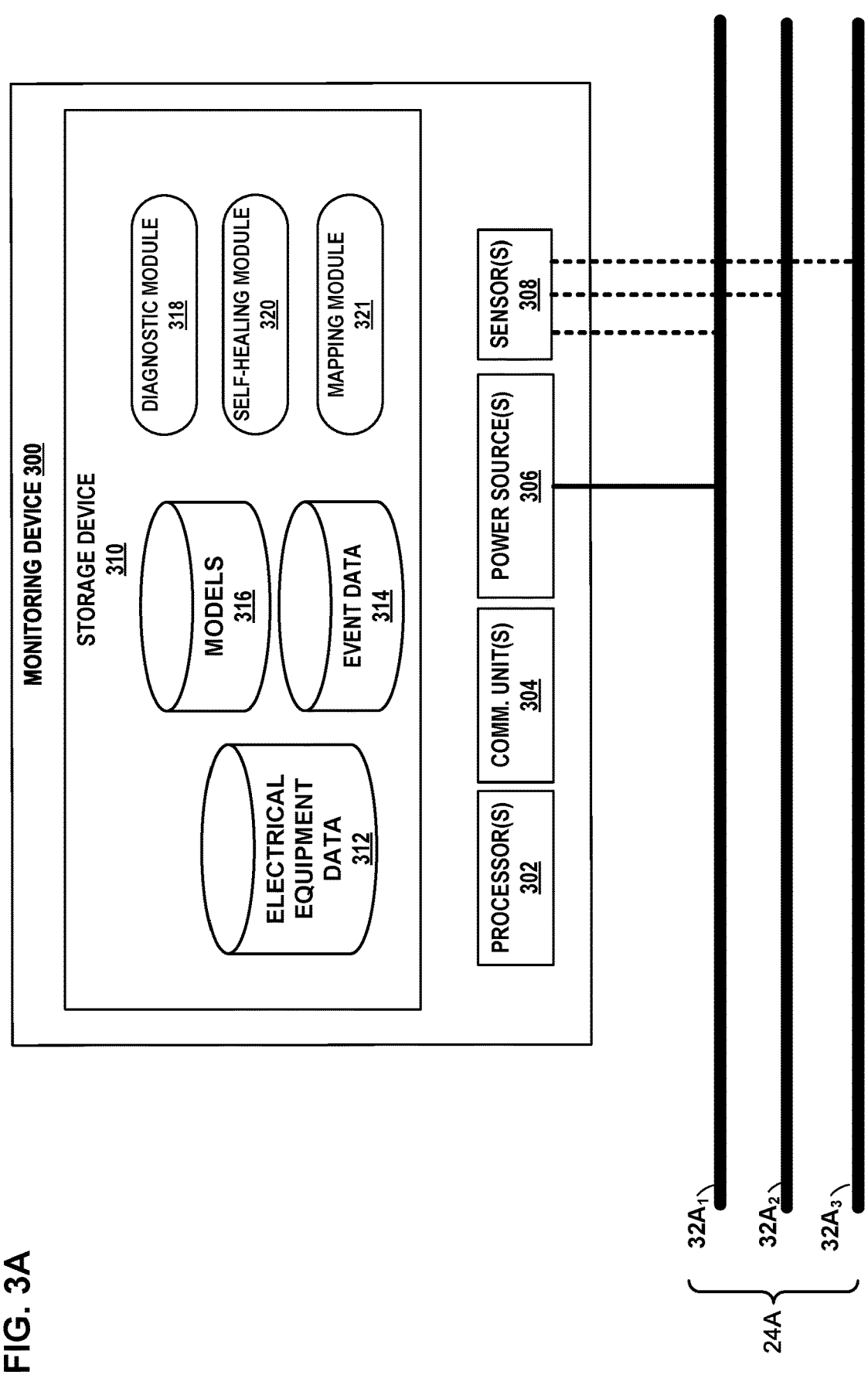
FIGS. 3A-3C are conceptual diagrams of an example monitoring device configured to monitor characteristics of an electrical cable, in accordance with various techniques of this disclosure.
Figure 3B:
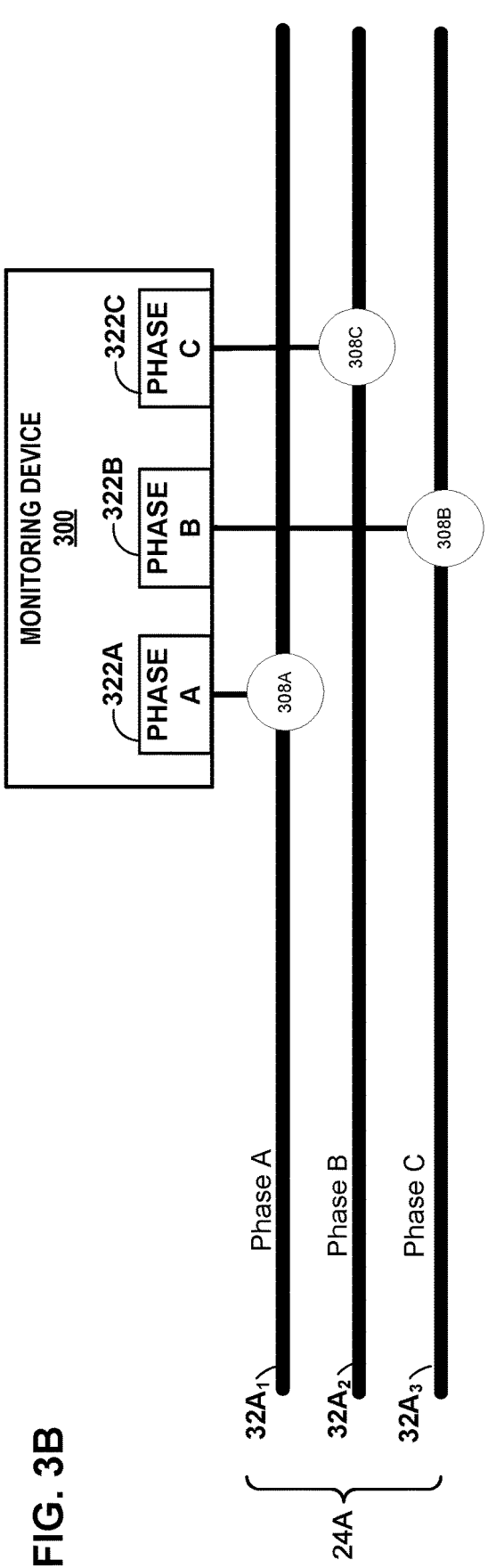
Figure 3C:
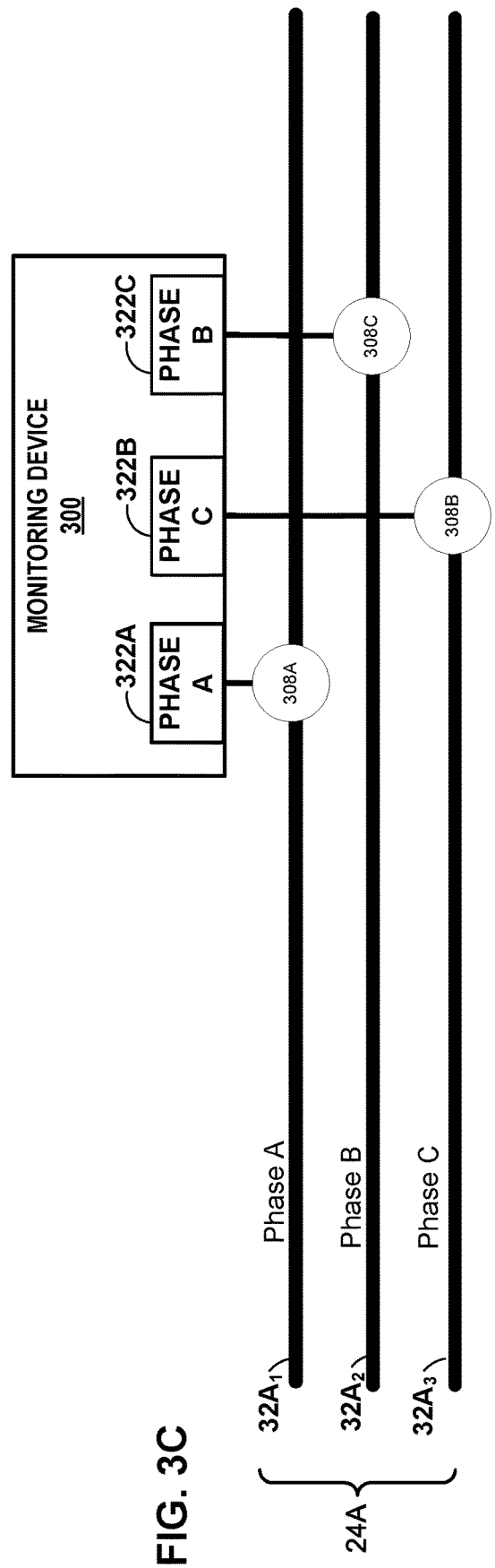

FIGS. 3A-3C are conceptual diagrams of an electrical cable monitoring device configured to monitor characteristics of an electrical cable, in accordance with various techniques of this disclosure. Monitoring device 300 may be an example of monitoring devices 33 of FIG. 1.

In some examples, monitoring device 300 includes at least one processor 302, at least one communication unit 304, at least one power source 306, at least one sensor 308, and at least one storage device 310. FIGS. 3A-3C illustrates one example of a monitoring device 300. Many other examples of monitoring device 300 may be used in other instances and may include a subset of the components included in example monitoring device 300 or may include additional components not shown in the example monitoring device 300 in FIGS. 3A-3C.

Monitoring device 300 includes one or more power sources 306 to provide power to components shown in monitoring device 300. In some examples, power sources 306 include a primary power source to provide electrical power and a secondary, backup power source to provide electrical power if the primary power source is unavailable (e.g., fails or is otherwise not providing power). In some examples, power source 306 includes a battery, such as a Lithium Ion battery. As another example, power source 306 may include a power harvesting device or circuit configured to derive power from an external source. Power source 306 may include a power harvesting circuit configured to harvest power from electrical cables 32A. For example, electrical cables 31A generate a magnetic field when current flows through electrical cables 32. Power source 306 may include a circuit that generates a current based on the magnetic field, such that the current generated by power source 306 may provide electrical power to monitoring device 300. In some examples, power source 306 may include a piezoelectric power harvesting device, thermoelectric power harvesting device, photovoltaic harvesting device, or any other power harvesting device.

One or more processors 302 may implement functionality and/or execute instructions within monitoring device 300. For example, processors 302 may receive and execute instructions stored by storage device 310. These instructions executed by processors 302 may cause monitoring device 300 to store and/or modify information, within storage devices 310 during program execution. Processors 302 may execute instructions of components, such as diagnostic module 318 and self-healing module 320, to perform one or more operations in accordance with techniques of this disclosure. That is, diagnostic module 318 and self-healing module 320 may be operable by processor 302 to perform various functions described herein.

One or more communication units 304 of monitoring device 300 may communicate with external devices by transmitting and/or receiving data. For example, monitoring device 300 may use communication units 304 to transmit and/or receive radio signals on a radio network such as a cellular radio network. Examples of communication units 304 include a network interface card (e.g. such as an Ethernet card), an optical transceiver, a radio frequency transceiver, a GPS receiver, or any other type of device that can send and/or receive information. Other examples of communication units 304 may include Bluetooth®, GPS, cellular (e.g., 3G, 4G), LPWAN, and Wi-Fi® radios. As another example, communications unit 304 may communicate with external devices by transmitting and/or receiving data via wired communication.

Communication units 304 may be configured to send and receive data via electrical cables 32A using power line communication (PLC) techniques. Communications unit 304 may enable power line communications over narrowband frequencies (e.g., approximately 500 kHz or lower) or broadband frequencies (e.g., approximately 1 MHz or higher). In contrast to utilizing inductive coupling (which may be costly, heavy, and challenging to install), communication unit 304 may include a capacitive coupling circuit to inject data into, and extract data from, electrical cables 32A.

Monitoring device 300 includes one or more sensors 308 configured to generate sensor data that is indicative of one or more conditions of monitoring device 300. Examples of sensors 308 include temperature sensors (e.g., internal and/or external to the cable accessory), partial discharge sensors, voltage and/or current sensors, among others. Sensors 308 may be attached on, inside, or near the monitoring device 300. In some examples, sensors 308 include one or more temperature sensors, such as an internal temperature sensor to monitor the temperature inside monitoring device 300 and/or an external temperature monitor to monitor the temperature outside or on the surface of cable accessory 34. Sensors 308 may include a partial discharge sensor to detect partial discharges within monitoring device 300. As another examples, sensors 308 may include a voltage and/or current sensor configured to measure the phase and/or magnitude (also referred to as amplitude) of the voltage or current of electrical cables 32A.

Sensors 308 may be configured to detachably couple to electrical cables 32A. In the example of FIG. 3A, sensors 308 are shown as connected to electrical cables 32A in dashed lines to indicate that sensors 308 can be attached to any of electrical cables 32A.

One or more storage devices 310 may store information for processing by processors 302. In some examples, storage device 310 is a temporary memory, meaning that a primary purpose of storage device 310 is not long-term storage. Storage device 310 may be configured for short-term storage of information as volatile memory and therefore not retain stored contents if deactivated. Examples of volatile memories include random access memories (RAM), dynamic random access memories (DRAM), static random access memories (SRAM), and other forms of volatile memories known in the art.

Storage device 310 may, in some examples, also include one or more computer-readable storage media. Storage device 310 may be configured to store larger amounts of information than volatile memory. Storage device 310 may further be configured for long-term storage of information as non-volatile memory space and retain information after activate/off cycles. Examples of non-volatile memories include, flash memories, or forms of electrically programmable memories (EPROM) or electrically erasable and programmable (EEPROM) memories. Storage device 830 may store program instructions and/or data associated with components such as diagnostic module 318, self-healing module 320, and mapping module 321.

In the example of FIG. 3A, storage devices 310 include electrical equipment data repository 312, event data repository 314, models repository 316, diagnostic module 318, and self-healing module 320. Data repositories 312, 314, and 316 may include relational databases, multi-dimensional databases, maps, and hash tables, or any data structure that stores data. In some examples, electrical equipment data repository 312 may be similar to, and may include data similar to, electrical equipment data repository 74A of FIG. 2. Likewise, event data repository 314 may be similar to, and may include data similar to, event data 74B as described in FIG. 2.

According to aspects of this disclosure, diagnostic module 318, self-healing module 320, and mapping module 321 may be operable by one or more processors 302 to perform one or more actions based on the sensor data generated by sensors 308. Diagnostic module 318, self-healing module 320, and mapping module 321 may be similar to and may include all or a subset of the functionality of, diagnostic service 68C, self-healing service 68De of FIG. 2, respectively.

In some examples, diagnostic module 318 may determine whether one or more sensors 308 are installed and/or configured correctly based at least in part on sensor data generated by sensors 308. For example, diagnostic module 318 may apply one or more rules to the sensor data generated by one or more of sensors 308 to determine whether sensors 308 are installed on electrical cables 32 correctly. The rules may be preprogrammed or learned, for example, via machine learning. According to some examples, models data store 316 includes rules trained based at least in part on event data collected from a plurality of sensors 308. In such examples, diagnostic module 318 may train the one or more models in models repository 316 based on event data within event data repository 314. As another example, monitoring device 300 may receive data representing one or more models from EEMS 6 of FIGS. 1 and 2 and may store the models in models repository 316.

In some examples, diagnostic module 318 applies one or more of the models stored in models repository 316 to event data repository 314 and other data, such as data within electrical equipment data repository 312 to determine whether sensors 308 are installed or configured correctly. For example, diagnostic module 318 may apply one or more of the models stored in models repository 316 to data indicative of the current and/or voltage zero-crossing sequence for electrical cables 32A to determine whether sensors 308 are installed correctly.

Diagnostic module 318 may determine whether sensors 308 are installed and/or configured correctly by determining whether each of sensors 308 is installed on an electrical cable 32A that is assigned to an electrical phase different than the electrical phase assigned to the respective sensor 308, whether sensors 308 are is oriented in an expected orientation (e.g., whether the sensors are installed backwards), whether each sensor 308 is installed on an electrical cable 32A of a power line different 24A than the power line to which the respective sensor is assigned, or whether sensors 308 are calibrated correctly.

As illustrated in FIGS. 3B and 3C, in one example, sensors 308 are assigned to a particular electrical phase. For example, monitoring device 300 may include a plurality of receptacles 322A-322C (collectively, receptacles 322) that are each assigned to a different electrical phase. For example, receptable 322A may be assigned to electrical phase-A, receptacle 322B may be assigned to electrical phase-B, and receptacle 322C may be assigned to electrical phase-C.

As illustrated in FIG. 3B, the technician may couple sensor 308A to receptacle 322A. When sensor 308A is coupled to receptacle 322A, monitoring device 300 may initially assign sensor 308A to electrical phase-A and may store data assigning sensor 308A to electrical phase-A in electrical equipment data 312. Similarly, the technician may couple sensor 308B to receptable 322B and sensor 308C to receptable 322C, such that monitoring device 300 assign sensor 308B to electrical phase-B and assign sensor 308C to electrical phase C within electrical equipment data 312.

As illustrated in FIG. 3B, a technician correctly installs sensor 308A on electrical cable $32A_1$. Thus, sensor 308A is initially assigned to electrical phase-A and is installed on electrical cable $32A_1$ which is also assigned to electrical phase-A, such that sensor 308A actually measures a current or voltage for electrical phase-A. In the example of FIG. 3B, the technician may incorrectly install sensor 308B on electrical cable $32A_3$ and sensor 308C on electrical cable $32A_3$. In such examples, sensor 308B is initially assigned to electrical phase-B but is installed on electrical cable $32A_3$ which is actually assigned to electrical phase-C, such that sensor 308C actually measures a current or voltage for electrical phase-C. Similarly, sensor 308C is initially assigned to electrical phase-C but is installed on electrical cable $32A_2$ which is actually assigned to electrical phase-B, such that sensor 308C actually measures a current or voltage for electrical phase-B.

In the example of FIG. 3B, diagnostic module 318 determines that sensors 308B and 308C are installed incorrectly based on the zero-crossing sequences detected by sensors 308A-308C. For example, diagnostic module 318 may determine that sensors 308B and 308C are installed on electrical cables that are assigned to electrical phases which are different from the electrical phases initially assigned to the respective sensors.

Self-healing module 320 determines a plurality of candidate solution sets to correct the erroneous installation. In one example, self-healing module 320 determines the highest scoring candidate solution set is the candidate solution set that assigns sensor 308B to electrical phase-C (e.g., because sensor 308B is actually installed on electrical cable $32A_3$ which is assigned to electrical phase-C) and assigns sensor 308C to electrical phase-B (e.g., because sensor 308C is actually installed on electrical cable 32B which is assigned to electrical phase-B).

Self-healing module 320 may perform various actions based on whether or not sensors 308 are installed and/or configured correctly. Self-healing module 320 may automatically correct an installation or configuration error in response to determining that sensors 308 are installed or configured incorrectly. For example, as illustrated in FIG. 3C, self-healing module 320 may assign receptacle 322B and sensor 308B to electrical phase-C and assign sensor 308C and receptacle 322C to electrical phase-B based on the highest scoring candidate solution set. In such examples, self-healing module 320 may update electrical equipment data 312 based on the updated assignments. In another example, self-healing module 320 may automatically re-calibrate sensors 308 in response to determining sensors 308 are calibrated incorrectly.

In some scenarios, diagnostic module 318 determines that an installation or configuration error cannot be corrected automatically. Self-healing module 320 may output a notification indicating that an installation or configuration error cannot be automatically corrected in response to determining that the error cannot be automatically corrected. In one instance, self-healing module 320 automatically schedules a service call to re-install and/or re-configure sensors 308 in response to determining that the error cannot be automatically corrected.

Figure 4:
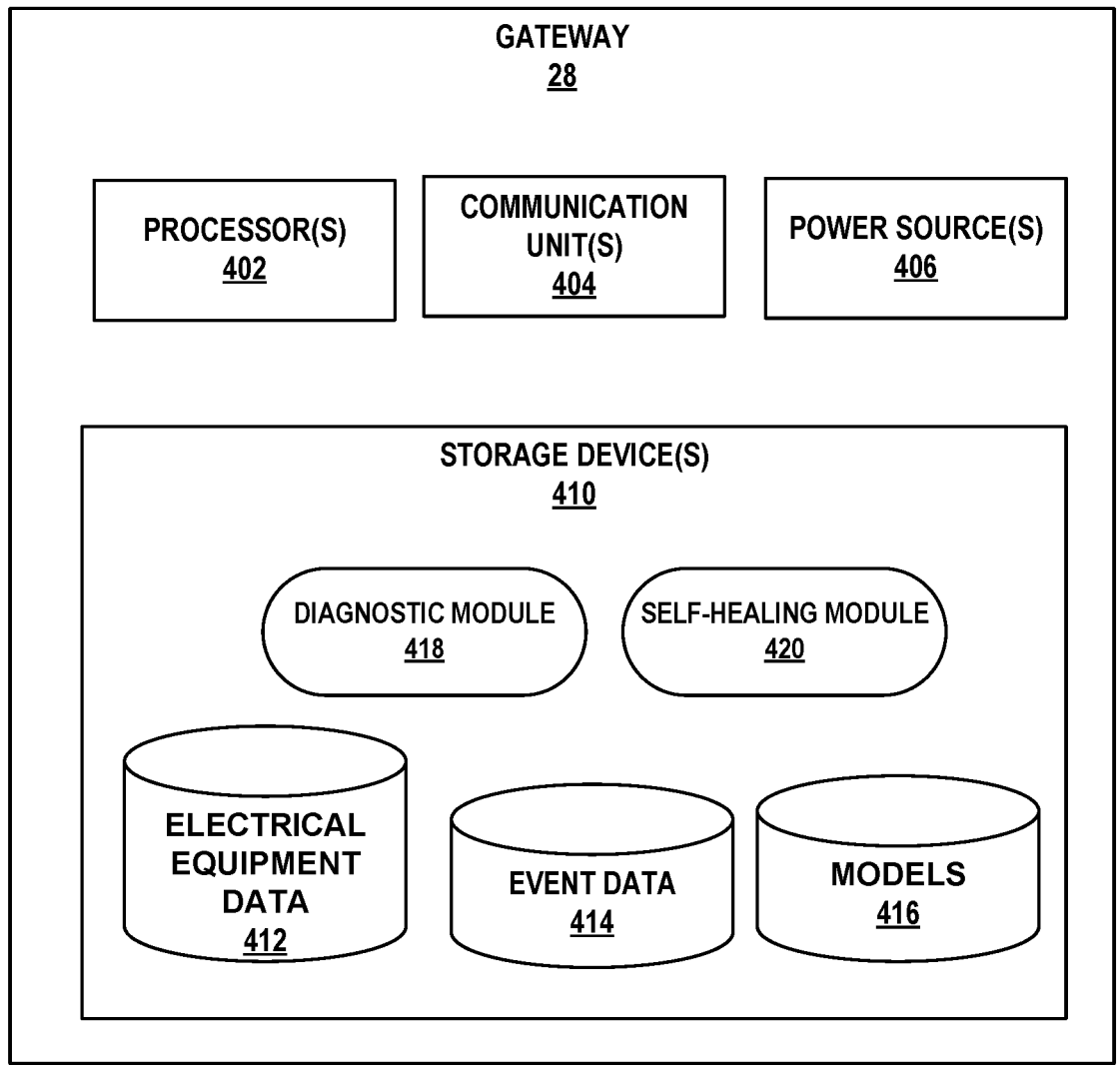
FIG. 4 is a block diagram illustrating an example gateway that is configured to communicate with a monitoring device and EEMS, in accordance with various techniques of this disclosure.

FIG. 4 is a block diagram illustrating an example gateway 28 that is configured to communicate with a cable accessory 34A and EEMS 6, in accordance with various techniques of this disclosure. FIG. 4 illustrates only one particular example of gateway 28. Many other examples of gateway 28 may be used in other instances and may include a subset of the components illustrated in FIG. 4 and/or may include additional components not shown in FIG. 4.

As shown in FIG. 4, gateway 28 includes one or more processors 402, one or more communication units 404, one or more power sources 406, and one or more storage devices 410. Processors 402, communication units 404, power sources 406, and storage components 410 may be similar to and include functionality similar to processors 302, communication units 304, power sources 306, and storage components 310 of FIG. 3A. Thus, a description of processors 402, communication units 404, power sources 406, and storage components 410 is omitted for brevity.

Gateway 28 may receive event data from a plurality of cable accessories 34 of one or more lines 24. The event data received by gateway 28 may include data indicative of sensor data generated by sensors of the respective monitoring devices (e.g., monitoring cable accessories), such as all or part of the sensor data, a summary of the sensor data, and/or analysis results based on the sensor data. Gateway 28 may store all or a subset of the event data in event data repository 414. In some examples, gateway 28 may receive a notification from one or more monitoring devices 33 indicating whether one or more sensors are installed or configured correctly.

Gateway 28 may act as an intermediary between monitoring devices 33 and EEMS 6. For example, gateway 28 may receive event data and/or notifications from monitoring devices 33 and may send the event data and notifications to EEMS 6. As another example, gateway 28 may receive data from EEMS 6. For instance, gateway 28 may receive firmware updates from EEMS 6, and may send the firmware updates from EEMS 6 to monitoring devices 33.

According to aspects of this disclosure, diagnostic module 418 and self-healing module 420 may be operable by one or more processors 402 to perform one or more actions based on the sensor data generated by sensors of monitoring devices 33. Diagnostic module 418 and self-healing module 420 may be similar to and may include all or a subset of the functionality of, diagnostic service 68C and self-healing service 68D of FIG. 2, respectively.

Diagnostic module 418 may determine whether one or more sensors 308 are installed and/or configured correctly based at least in part on sensor data generated by sensors 308. In some examples, diagnostic module 418 applies one or more of the models stored in models repository 316 to event data repository 314 and other data, such as data within electrical equipment data repository 312 to determine whether sensors 308 are installed or configured correctly. For example, diagnostic module 418 may apply one or more of the models stored in models repository 316 to data indicative of the current and/or voltage zero-crossing sequence for electrical cables 32A to determine whether sensors 308 are installed correctly.

Diagnostic module 418 may determine whether sensors 308 are installed and/or configured correctly by determining whether each of sensors 308 is installed on an electrical cable 32A that is assigned to an electrical phase different than the electrical phase assigned to the respective sensor 308, whether sensors 308 are is oriented in an expected orientation (e.g., whether the sensors are installed backwards), whether each sensor 308 is installed on an electrical cable 32A of a power line different 24A than the power line to which the respective sensor is assigned, or whether sensors of monitoring devices 33 are calibrated correctly.

Self-healing module 420 may perform various actions based on whether or not sensors 308 are installed and/or configured correctly. Self-healing module 230 may automatically correct an installation or configuration error in response to determining that sensors 308 are installed or configured incorrectly. In one example, self-healing module 420 may automatically re-calibrate sensors of monitoring devices 33 in response to determining the sensors are calibrated incorrectly.

In another example, self-healing module 420 may automatically re-assign one or more of the sensors of monitoring devices 33 to a different phase or to a different power line 24 in response to determining that the sensors are installed or configured incorrectly. In some scenarios, diagnostic module 418 determines that an installation or configuration error cannot be corrected automatically. Self-healing module 420 may output a notification indicating that an installation or configuration error cannot be automatically corrected in response to determining that the error cannot be automatically corrected. In one instance, self-healing module 420 automatically schedules a service call to re-install and/or re-configure the sensors in response to determining that the error cannot be automatically corrected.

Gateway 28 may output data to EEMS 6. In some examples, gateway 28 sends all or a portion of the event data from monitoring devices 33 to EEMS 6. As another example, gateway 28 may send notifications (e.g., generated by monitoring devices 33 and/or gateway 28) to EEMS 6. For instance, gateway 28 may output a notification indicating one or more sensors of monitoring devices 33 are installed incorrectly.

Figure 5:
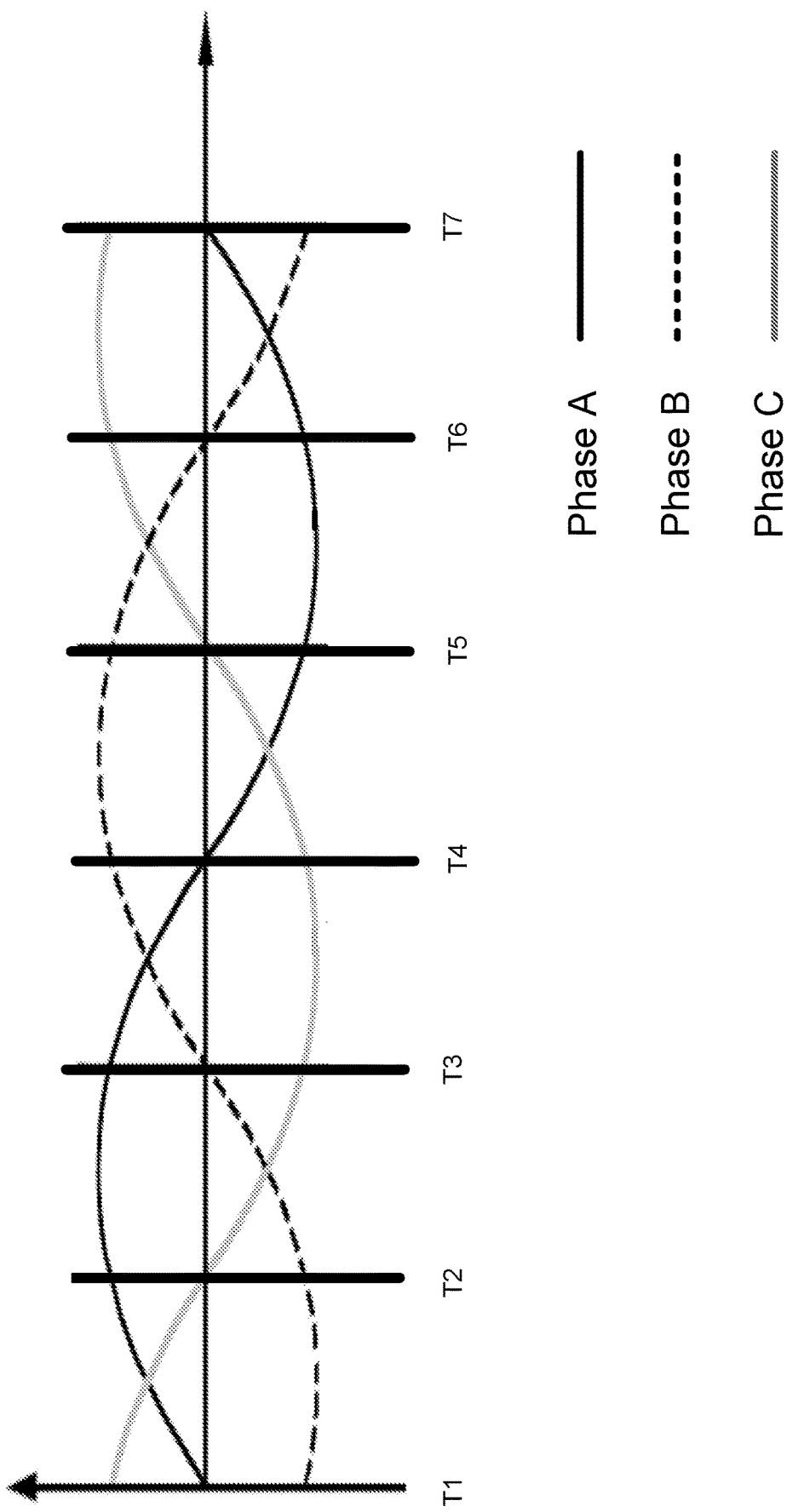
FIG. 5 is an example waveform of a multiphase powerline, in accordance with techniques of this disclosure.

FIG. 5 is an example waveform of a multiphase power-line, in accordance with techniques of this disclosure. The example waveform of FIG. 5 illustrates a reference zero-crossing sequence for a 3-phase power line. For ease of description only, the example waveform is described as a current waveform. However, it is to be understood that the example waveform may represent a current or voltage.

At time T1, the current assigned to electrical phase-A crosses from a negative value to a positive value. That is, the polarity of the zero-crossing event of the reference zero-crossing sequence is a negative-to-positive zero-crossing event for electrical phase-A at time T1. At time T3, the current assigned to electrical phase-B crosses from a negative value to a positive value. That is, the polarity of the zero-crossing event of the reference zero-crossing sequence is a negative-to-positive zero-crossing event for electrical phase-B at time T3. At time T5, the current assigned to electrical phase-C crosses from a negative value to a positive value. That is, the polarity of the zero-crossing event of the reference zero-crossing sequence is a negative-to-positive zero-crossing event for electrical phase-C at time T5.

At time T2, the current assigned to electrical phase-C crosses from a positive value to a negative value. That is, the polarity of the zero-crossing event of the reference zero-crossing sequence is a positive-to-negative zero-crossing event for electrical phase-C at time T2. At time T4, the current assigned to electrical phase-A crosses from a positive value to a negative value. That is, the polarity of the zero-crossing event of the reference zero-crossing sequence is a positive-to-negative zero-crossing event for electrical phase-A at time T4. At time T6, the current assigned to electrical phase-B crosses from a positive value to a negative value. That is, the polarity of the zero-crossing event of the reference zero-crossing sequence is a positive-to-negative zero-crossing event for electrical phase-B at time T6.

As shown in the example of FIG. 5, the reference zero-crossing sequence for a 3-phase power line includes zero crossing events in a given direction (e.g., positive-to-negative or negative-to-positive) every 120-degrees (e.g., 360-degrees divided by three phases), with zero-crossing events in either direction every 60-degrees.

A computing device, such as EEMS 6, may compare sensor data generated by one or more sensors of a monitoring device 33 to the reference zero-crossing sequence of FIG. 5 to determine whether one or more sensors are installed and/or configured correctly. For example, EEMS 6 may determine that the sensors of monitoring device 33A are not installed correctly in response to determining that an actual zero-crossing sequence does not correspond to the reference zero-crossing sequence depicted in FIG. 5. For example, EEMS 6 may detect a negative-to-positive zero-crossing event for a sensor initially assigned to electrical phase-A followed by another negative-to-positive zero-crossing for a sensor initially assigned to electrical phase C separated by 60-degrees (e.g., rather than 120 degrees or 240 degrees), which may indicate that a current sensor assigned to electrical phase-C is installed incorrectly (e.g., backward).

Figure 6:
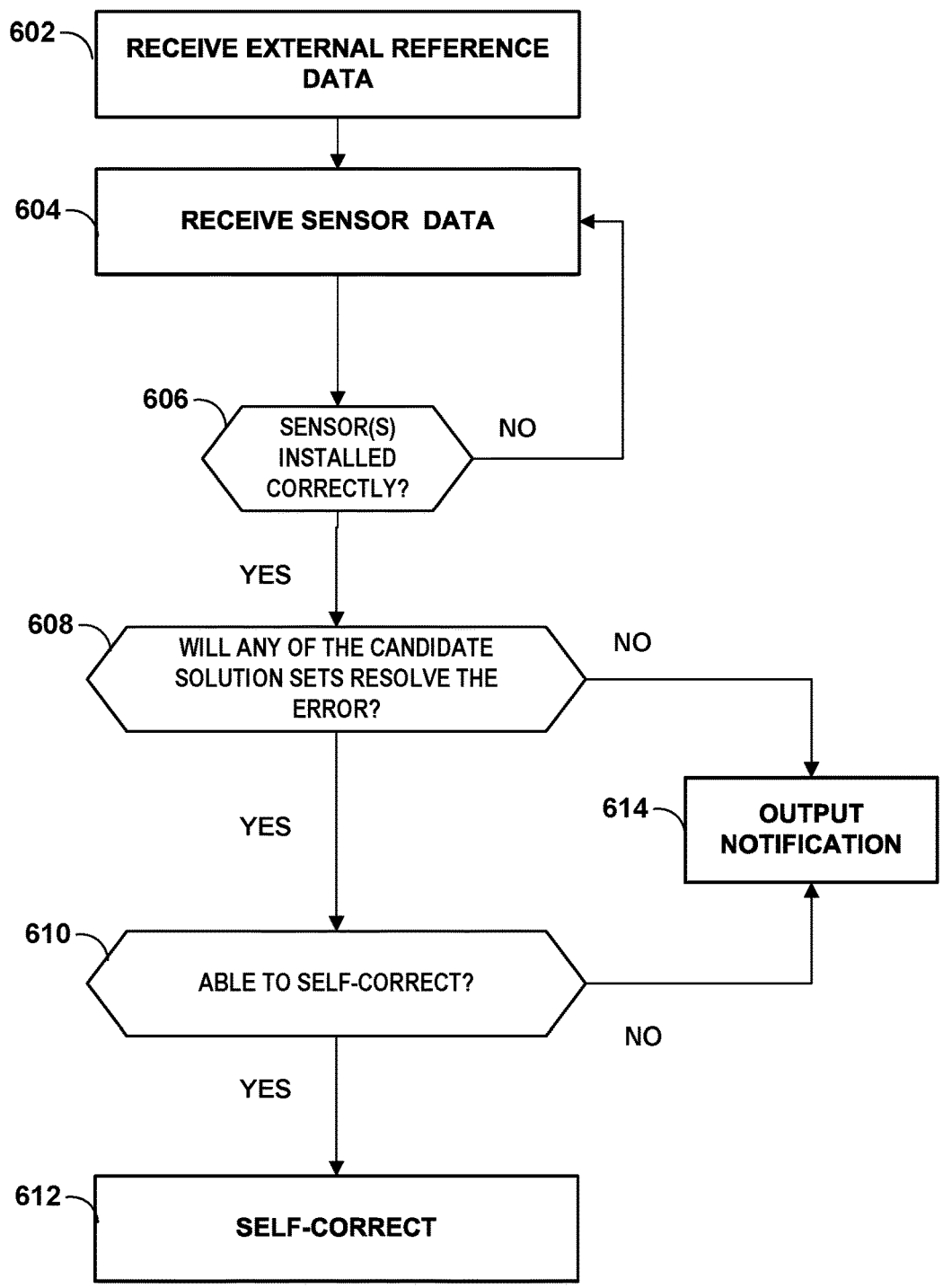
FIG. 6 is a flow chart illustrating example operations performed by one or more computing devices that are configured to diagnose and correct sensor installation errors and, in some cases, automatically reconfigure one or more components of the power grid so as to provide self-healing management over the power grid, in accordance with various techniques of this disclosure.

FIG. 6 is a flow chart illustrating example operations performed by one or more computing devices that are configured to diagnose and correct sensor installation errors and, in some cases, automatically reconfigure one or more components of the power grid so as to provide self-healing management over the power grid, in accordance with various techniques of this disclosure. FIG. 6 is described with reference to the system described in FIGS. 1 and 2.

In the example of FIG. 6, EEMS 6 receives external reference data (602). The external reference data may include data indicative of a reference zero-crossing sequence, a reference voltage and/or current amplitude, a reference fingerprint, or other characteristics of one or more electrical cables 32 as measured at an external location, such as at a source of the power. In some examples, the external reference data includes input assignments of one or more electrical cables and/or power lines, such as data identifying which electrical cables 32 are part of a particular power line 24 (also referred to as a feeder line) and/or data identifying the phases assigned to the various electrical cables 32.

EEMS 6 receives event data, including sensor data, from monitoring devices 33 (604). Monitoring devices 33 may communicate the event data to EEMS 6 via wired and/or wireless communication devices.

According to some examples, EEMS 6 determines whether one or more sensors are installed correctly (606). In one example, EEMS 6 determines whether a sensor is installed correctly by determining whether an orientation of the sensor corresponds to the expected orientation (e.g., whether the sensor is installed backwards), whether the phase assigned to the sensor is different than the phase assigned to the electrical cable to which the sensor is installed, or whether the sensor is calibrated correctly.

EEMS 6 determines, in some scenarios, a plurality of candidate solution sets. Each of the candidate solution sets may include a plurality of candidate sensor assignment sets, a plurality of candidate sensor orientation sets, or both, such as the candidate solution sets illustrated in Table 1 above. As illustrated in FIG. 6, EEMS 6 determines whether any of the candidate solution sets will resolve the error (608). For example, EEMS 6 may score or rank each of the candidate solutions sets. In one example, EEMS 6 determines whether the highest scoring candidate solution set will resolve the error by determining whether a zero-crossing sequence of the highest scoring candidate solution set matches the reference zero-crossing sequence. EEMS 6 may output a notification (614) in response to determining that none of the candidate solution sets resolve the installation error ("NO" path of 608). In another example, EEMS 6 schedules a service call or maintenance in response to determining that none of the candidate solution sets resolve the error.

In one example, EEMS 6 determines whether EEMS 6 is able to self-correct or self-heal the installation error (610) in response to determining that one or more candidate solution sets resolves the installation error ("YES" path of 608). For example, EEMS 6 may determine whether the candidate solution set that resolve the error includes re-assigning a sensor to a different phase or re-assigning the sensor to a different polarity (e.g., by shifting the phase 180-degrees). EEMS 6 may output a notification (614) in response to determining that EEMS 6 is unable to automatically correct the installation error, such as when two current sensors are installed on the same electrical cable ("NO" path of 610). In another example, EEMS 6 schedules a service call or maintenance in response to determining that none of the candidate solution sets resolve the error.

According to some scenarios, EEMS 6 self-corrects the installation error (612) in response to determining that EEMS 6 is able to self-correct the error ("YES" path of 610). For example, EEMS 6 may re-assign one or more sensors to a different phase and/or re-assign the polarity of one or more sensors.

Figure 7A:
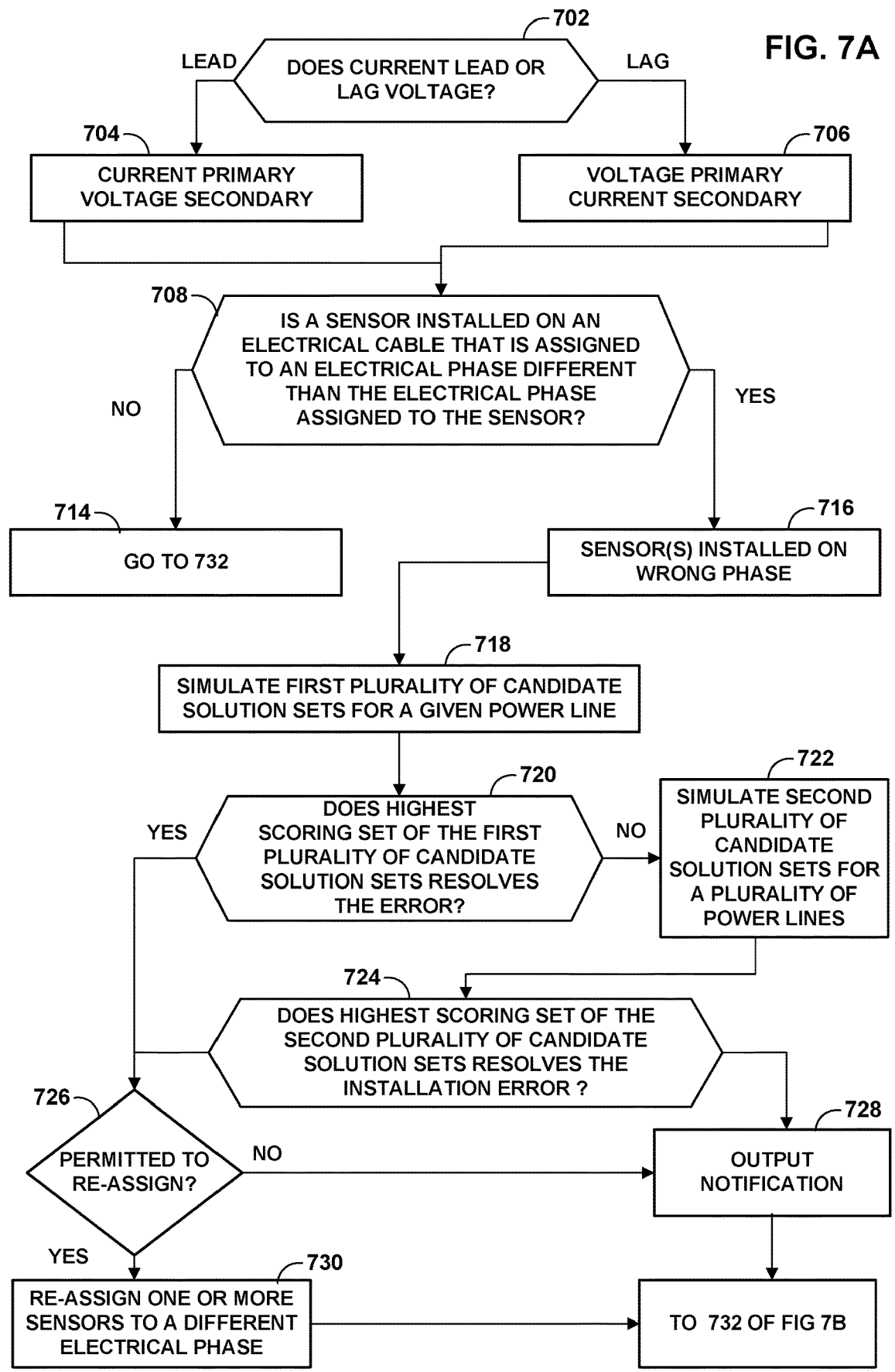
FIGS. 7A and 7B are a flow chart illustrating example operations performed by one or more computing devices that are configured to diagnose and correct sensor installation errors and, in some cases, automatically reconfigure one or more components of the power grid so as to provide self-healing management over the power grid, in accordance with various techniques of this disclosure.
Figure 7B:
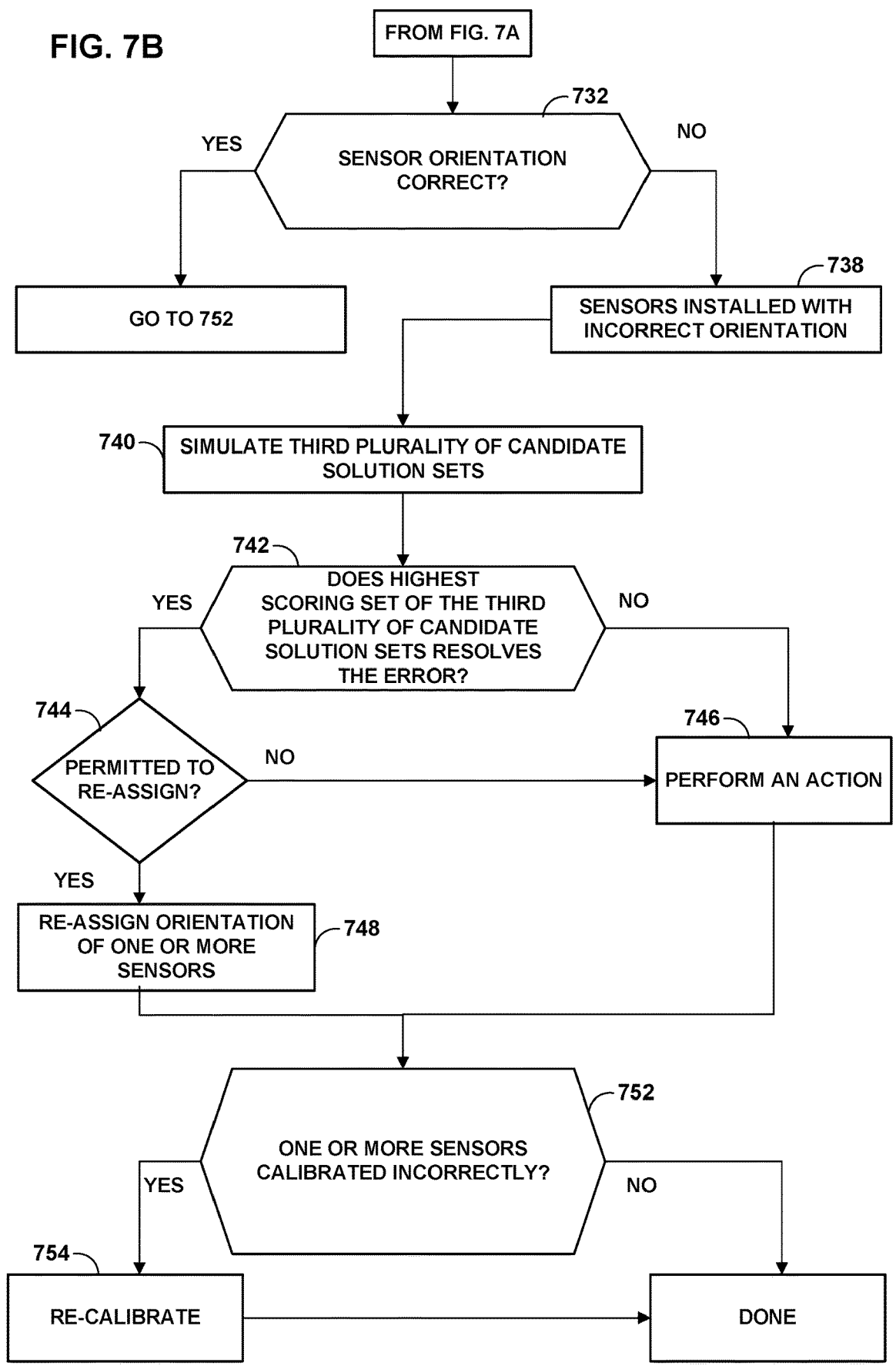

FIGS. 7A-7B are a flow chart illustrating example operations performed by one or more computing devices that are configured to diagnose and correct sensor installation errors and, in some cases, automatically reconfigure one or more components of the power grid so as to provide self-healing management over the power grid, in accordance with various techniques of this disclosure. FIG. 7 is described with reference to the system described in FIGS. 1 and 2.

In the example of FIG. 7A, diagnostic service 68C determines whether the current in electrical cables 32A of power line 24A lags the voltage or whether the current leads the voltage (702). In one example, diagnostic service 68C assigns the current as the primary reference characteristic and assigns voltage as the secondary reference characteristic in response to determining that current leads voltage (or that voltage measurements are not available) (704). In another example, if the voltage leads the current, diagnostic service 68C assigns the voltage as the primary reference characteristic and assigns voltage as the secondary reference characteristic (706).

In one example, diagnostic service 68C determines whether sensors of monitoring device 33 are installed correctly by determining whether each sensor is installed on an electrical cable that is assigned to an electrical phase different than the electrical phase assigned to the sensor (708). In other words, diagnostic service 68C determines whether the phase assigned to a given sensor is the same as the phase of the electrical cable to which the sensor is attached or otherwise configured to monitor. In one example, diagnostic service 68C determines the sensors of monitoring device 33A are installed on the correct phase (714) in response to determining that the zero-crossing sequence for the primary reference characteristic matches the reference zero-crossing sequence and that the zero-crossing sequence for the primary reference characteristic matches the zero-crossing sequence for the secondary reference characteristic. That is, in such examples, diagnostic service 68C determines that the given sensor is installed correctly because the phase assigned to the given sensor is the same as the phase of the electrical cable to which the given sensor is attached.

In some instances, diagnostic service 68C determines the sensors of monitoring device 33A are installed on the wrong phase (e.g., are installed incorrectly) (716) in response to determining that the zero-crossing sequence for the primary reference characteristic does not correspond to the reference zero-crossing sequence or the zero-crossing sequence for the secondary reference characteristic. In other words, in such instances, diagnostic service 68C determines that a given sensor is not installed correctly because the phase assigned to the given sensor is not the same as the phase of the electrical cable to which the given sensor is attached or otherwise configured to monitor.

Self-healing service 68D determines or simulates a first plurality of candidate solution sets to the erroneous installation for a given power line (718) in response to determining that one or more of sensors are installed on an electrical cable that is assigned to an electrical phase different than the electrical phase assigned to the sensor. In other words, self-healing service 68D determines a first plurality of candidate solution sets, each candidate solution set of the first plurality of candidate solution sets indicating a unique combination of phase assignments for each of the sensors on a given power line 24.

Self-healing service 68D may determine a solution score for each candidate solution set in the first plurality of candidate solution sets. Self-healing service 68D determine whether the highest scoring candidate solution set of the first plurality of candidate solution sets resolves the error (720). For example, self-healing service 68D may determine a prospective zero-crossing sequence that would exist for the primary reference characteristics (e.g., current zero-crossing sequence) and the secondary reference characteristic (e.g., voltage zero-crossing sequence) if the sensors were assigned according to the assignments of the highest scoring candidate solution set. In such examples, self-healing service 68D may determine that the highest scoring candidate solution set corrects or resolves the installation error in response to determining that the prospective zero-crossing sequence of the primary reference characteristic (e.g., current) matches the reference zero-crossing sequence and the prospective zero-crossing sequence of the secondary reference characteristic (e.g., voltage) ("YES" path of 724).

In some instances, self-healing service 68D determines that the highest scoring candidate solution set of the first plurality of candidate solution sets does not resolve the installation error ("NO" path of 720). For instance, self-healing service 68D may determine that none of the candidate solution sets of the first plurality of candidate solution sets will correct the installation error in response to the zero-crossing sequence of the primary reference characteristic does not match the reference zero-crossing sequence and/or does not match the zero-crossing sequence of the secondary reference characteristic. In such instances, self-healing service 68D determines or simulates a second plurality of candidate solution sets that are associated with phase assignments for sensors of a plurality of power lines monitored by the same monitoring device, such as sensors of monitoring device 33A that monitor power lines 24A and 24B (722). Self-healing service 68D may score each candidate solution set of the second plurality of candidate solution sets.

Self-healing service 68D determines whether any of the candidate solution sets in the second plurality of solution sets resolves the installation error. In one example, self-healing service 68D determines whether the highest scoring candidate solution set of the second plurality of candidate solution sets resolves the installation error (724). For example, self-healing service 68D may determine a prospective zero-crossing sequence that would exist for the primary reference characteristics (e.g., current zero-crossing sequence) and the secondary reference characteristic (e.g., voltage zero-crossing sequence) if the sensors were assigned according to the assignments of the highest scoring candidate solution set.

Self-healing service 68D determines, in some examples, that the highest scoring solution set does not resolve the installation error ("NO" path of 724) in response to determining that the prospective zero-crossing sequence of the primary reference characteristic does not match the reference zero-crossing sequence and the prospective zero-crossing sequence of the secondary reference characteristic.

Self-healing service 68D determines, in some examples, that the highest scoring candidate solution set of the second plurality of candidate solution sets resolves the installation error ("YES" path of 724) in response to determining that the zero-crossing sequence of the primary reference characteristic matches the reference zero-crossing sequence and the zero-crossing sequence of the secondary reference characteristic.

According to one example, self-healing service 68D determines whether self-healing service 68D is permitted to re-assign one or more sensors to a different phase (726). For example, self-healing service 68D may outputting a notification (e.g., to computing devices 60) requesting authorization to self-correct the installation error. Responsive to receiving authorization to self-correct or self-heal the installation error, self-healing service 68D re-assigns the sensor to a phase associated with the electrical cable to which the sensor is installed based on the sensor-phase assignments indicated by the highest-scoring candidate solution set (730) from either the first plurality of candidate solution sets or the second plurality of candidate solution sets.

According to some examples, EEMS 6 performs an action (728) in response to determining that none of the candidate solution sets in the second plurality of candidate solutions sets resolve the installation error or that EEMS 6 is not authorized to re-assign one or more sensors to a different phase. In one example, notification service 68F performs the action by outputting a notification indicative of the installation error to another computing device and/or scheduling a service call.

According to some examples, diagnostic service 68C determines whether one or more sensors of monitoring device 33 are installed correctly by determining whether each current sensor is installed in the correct orientation (732). Diagnostic service 68C may determine that the orientation of one or more current sensors is incorrect (e.g., the sensor polarity is incorrect because the sensors are installed backward) in response to determining that the polarity of one or more zero-crossing events in the zero-crossing sequence do not correspond to the expected polarity of each respective zero-crossing event.

In one example, diagnostic service 68C determines the orientation of one or more current sensors is correct in response to determining the polarity of one or more zero-crossing events corresponds (e.g., matches) to the expected polarity of the zero-crossing event ("YES" path of 732). In another example, diagnostic service 68C determines the orientation of one or more current sensors is not correct in response to determining the polarity of one or more zero-crossing events does not correspond to the expected polarity of the zero-crossing event ("NO" path of 732).

Self-healing service 68D determines or simulates a third plurality of candidate solution sets to the erroneous installation (740) in response to determining that one or more of the sensors of monitoring devices 33 are not oriented correctly. The third plurality of candidate solution sets may include a plurality of candidate sensor orientations. In one scenario, self-healing service 68D determines the third set of candidate solutions by determining various combinations (e.g., all candidate combinations) of sensor orientations. In other words, self-healing service 68D determines a third plurality of candidate solution sets, each candidate solution set indicating a unique combination of sensor orientations.

According to some instances, self-healing service 68D may determine a solution score for each candidate solution set in the third plurality of candidate solution sets, the solution score indicating a probability that the respective candidate solution set will correct the installation error. Self-healing service 68D determines whether the highest scoring candidate solution set of the third plurality of candidate solution sets will resolve or correct the installation error (742). Self-healing service 68D may determine the highest scoring candidate solution set corrects the installation error in response to in response to determining that the polarity of each zero-crossing event in a highest scoring solution set matches the polarity of each zero-crossing event in the reference zero-crossing sequence ("YES" path of 742").

Self-healing service 68D determines whether self-healing service 68D is permitted to re-assign the orientation of one or more sensors (744). For example, self-healing service 68D may outputting a notification (e.g., to computing devices 60) requesting authorization to self-correct the installation error. Responsive to receiving authorization to self-correct or self-heal the installation error, self-healing service 68D re-assigns the orientation of one or more sensors as indicated by the highest-scoring candidate solution set of the third plurality of candidate solution sets (748). For example, self-healing service 68D may re-assign the orientation by shifting the phase 180-degrees.

According to some examples, EEMS 6 performs an action (746) in response to determining that none of the candidate solution sets in the third plurality of candidate solutions sets resolve the installation error or that EEMS 6 is not authorized to re-assign the orientation of one or more sensors. In one example, notification service 68F performs the action by outputting a notification indicative of the installation error to another computing device and/or scheduling a service call.

Diagnostic service 68C may determine whether one or more sensors are calibrated incorrectly (752). Diagnostic service 68C determines, in one example, whether the sensor is calibrated correctly by determining whether the amplitude of the current and/or voltage is within an expected range of current or voltage, respectively. In one example, diagnostic service 68C determines that the sensor is not calibrated correctly in response to determining that the current or voltage measured by the sensor is not within the expected range.

Self-healing service 68D may perform an action to re-calibrate the sensors in response to determining that the sensors are not calibrated correctly (754). For example, self-healing service 68D may recalibrate the gain and conversion coefficients of for the sensor based on a reference current or voltage, such as the current or voltage present at the power source or at another monitoring system 33. In another examples, self-healing service 68D performs the action by outputting a notification, which may for example, include information indicating the calibration error.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "proximate," "distal," "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above or on top of those other elements.

As used herein, when an element, component, or layer for example is described as forming a "coincident interface" with, or being "on," "connected to," "coupled with," "stacked on" or "in contact with" another element, component, or layer, it can be directly on, directly connected to, directly coupled with, directly stacked on, in direct contact with, or intervening elements, components or layers may be on, connected, coupled or in contact with the particular element, component, or layer, for example. When an element, component, or layer for example is referred to as being "directly on," "directly connected to," "directly coupled with," or "directly in contact with" another element, there are no intervening elements, components or layers for example. The techniques of this disclosure may be implemented in a wide variety of computer devices, such as servers, laptop computers, desktop computers, notebook computers, tablet computers, hand-held computers, smart phones, and the like. Any components, modules or units have been described to emphasize functional aspects and do not necessarily require realization by different hardware units. The techniques described herein may also be implemented in hardware, software, firmware, or any combination thereof. Any features described as modules, units or components may be implemented together in an integrated logic device or separately as discrete but interoperable logic devices. In some cases, various features may be implemented as an integrated circuit device, such as an integrated circuit chip or chipset. Additionally, although a number of distinct modules have been described throughout this description, many of which perform unique functions, all the functions of all of the modules may be combined into a single module, or even split into further additional modules. The modules described herein are only exemplary and have been described as such for better ease of understanding.

If implemented in software, the techniques may be realized at least in part by a computer-readable medium comprising instructions that, when executed in a processor, performs one or more of the methods described above. The computer-readable medium may comprise a tangible computer-readable storage medium and may form part of a computer program product, which may include packaging materials. The computer-readable storage medium may comprise random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The computer-readable storage medium may also comprise a non-volatile storage device, such as a hard-disk, magnetic tape, a compact disk (CD), digital versatile disk (DVD), Blu-ray disk, holographic data storage media, or other non-volatile storage device.

The term "processor," as used herein may refer to any of the foregoing structure or any other structure suitable for implementation of the techniques described herein. In addition, in some aspects, the functionality described herein may be provided within dedicated software modules or hardware modules configured for performing the techniques of this disclosure. Even if implemented in software, the techniques may use hardware such as a processor to execute the software, and a memory to store the software. In any such cases, the computers described herein may define a specific machine that is capable of executing the specific functions described herein. Also, the techniques could be fully implemented in one or more circuits or logic elements, which could also be considered a processor.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor", as used may refer to any of the foregoing structure or any other structure suitable for implementation of the techniques described. In addition, in some aspects, the functionality described may be provided within dedicated hardware and/or software modules. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

It is to be recognized that depending on the example, certain acts or events of any of the methods described herein can be performed in a different sequence, may be added, merged, or left out altogether (e.g., not all described acts or events are necessary for the practice of the method). Moreover, in certain examples, acts or events may be performed concurrently, e.g., through multi-threaded processing, interrupt processing, or multiple processors, rather than sequentially.

In some examples, a computer-readable storage medium includes a non-transitory medium. The term "non-transitory" indicates, in some examples, that the storage medium is not embodied in a carrier wave or a propagated signal. In certain examples, a non-transitory storage medium stores data that can, over time, change (e.g., in RAM or cache).

What is claimed is:

1. A system comprising:
   a plurality of sensors coupled to multi-phase power lines comprising a plurality of electrical cables that are each associated with a respective phase, the plurality of sensors configured to generate sensor data that is indicative of one or more conditions of the electrical cables; and
   at least one processor configured to:
   receive the sensor data;
   determine, based at least in part on the sensor data, whether a sensor of the plurality of sensors is installed correctly,
   determine a zero-crossing sequence of a current or a voltage of each electrical cable of the plurality of electrical cables, the zero-crossing sequence including a plurality of zero-crossing events;
   determine whether the zero-crossing sequence corresponds to an expected zero-crossing sequence;
   determine whether the sensor is installed correctly based at least in part on whether the zero-crossing sequence corresponds to the expected zero-crossing sequence; and
   responsive to determining that the sensor is not installed correctly, perform an action.

2. The system of claim 1, wherein the at least one processor is configured to determine whether the sensor is installed correctly by determining whether the sensor is oriented in an expected orientation or whether an electrical phase assigned to the sensor does not correspond to an electrical phase of an electrical cable to which the sensor is attached.

3. The system of claim 1, wherein the at least one processor is configured to determine whether the sensor is installed correctly by at least being configured to:
determine a polarity of each zero-crossing event; and
determine whether the sensor is installed correctly based at least in part on the zero-crossing sequence and the polarity of each zero-crossing event.

4. The system of claim 1, wherein the processor is configured to perform the action by at least being configured to perform a self-healing operation to reconfigure at least one component of a power grid.

5. The system of claim 4, wherein the at least one processor is configured to perform the self-healing operation by one or more of:
re-assigning the sensor to a different phase; or
re-assigning the sensor to a different polarity.

6. The system of claim 5, wherein the at least one processor is configured to re-assigning the sensor to the different phase by at least being configured to:
determine a plurality of candidate sensor assignment sets, each candidate sensor assignment set uniquely assigning each sensor of the plurality of sensors to a respective electrical phase;
determine, for each candidate sensor assignment set, a score indicative of a probability that each sensor is assigned to a correct phase; and
determine, based on the score for each respective candidate sensor assignment set, a correct phase assignment for each sensor.

7. The system of claim 5, wherein the at least one processor is configured to re-assigning the sensor to a different polarity by at least being configured to:
determine a plurality of candidate sensor orientation sets, each candidate sensor orientation set uniquely assigning each sensor of the plurality of sensors to a respective orientation;
determine, for each candidate sensor orientation set, a score indicative of a probability that an orientation of each sensor is correct; and
determine, based on the score for each respective candidate sensor orientation set, a correct polarity of each sensor of the plurality of sensors.

8. The system of claim 1, wherein the at least one processor is configured to perform the action by at least being configured to:
responsive to determining that the sensor is not installed correctly:
output a notification indicating the sensor is not installed correctly, or
schedule a service call to re-install the sensor.

9. The system of claim 1, wherein the at least one processor is configured to determine whether the sensor is installed correctly by at least being configured to:
determine, based on the sensor data, one or more electrical characteristics of the electrical cables; and
determine a fingerprint of each electrical cable based on the electrical characteristics.

10. The system of claim 9, wherein the at least one processor is further configured to determine, based on the fingerprint of each electrical cable of the plurality of electrical cables, a set of sensors associated with a particular electrical cable.

11. The system of claim 9, wherein the at least one processor is further configured to determine, based on the fingerprint of each electrical cable of the plurality of electrical cables, a set of electrical cables associated with one another.

12. The system of claim 1, wherein the at least one processor is configured to determine whether the sensor is installed correctly by determining whether the sensor has been calibrated correctly.

13. A method comprising:
receiving, by a computing system, sensor data generated by a plurality of sensors coupled to multi-phase power lines comprising a plurality of electrical cables that are each associated with a respective phase, the sensor data indicative of one or more conditions of the electrical cables;
determining, by the computing system, based at least in part on the sensor data, whether a sensor of the plurality of sensors is installed correctly, wherein determining whether the sensor is installed correctly includes:
determining a zero-crossing sequence of a current or a voltage of each electrical cable of the plurality of electrical cables, the zero-crossing sequence including a plurality of zero-crossing events;
determining whether the zero-crossing sequence corresponds to an expected zero-crossing sequence;
determining whether the sensor is installed correctly based at least in part on whether the zero-crossing sequence corresponds to the expected zero-crossing sequence; and
responsive to determining that the sensor is not installed correctly, performing, by the computing system, an action.

14. The method of claim 13, wherein determining whether the sensor is installed correctly includes determining whether the sensor is oriented in an expected orientation or whether an electrical phase assigned to the sensor does not correspond to an electrical phase of the electrical cable to which the sensor is attached.

15. The method of claim 13, wherein determining whether the sensor is installed correctly includes:
determining a polarity of each zero-crossing event; and
determining whether the sensor is installed correctly based at least in part on the zero-crossing sequence and the polarity of each zero-crossing event.

16. The method of claim 13, wherein performing the action comprises performing a self-healing operation to reconfigure at least one component of a power grid.

17. The method of claim 16, wherein performing the self-healing operation comprises one or more of:
re-assigning the sensor to a different phase; or
re-assigning the sensor to a different polarity.

18. The method of claim 17, wherein re-assigning the sensor to the different phase comprises:
determining a plurality of candidate sensor assignment sets, each candidate sensor assignment set uniquely assigning each sensor of the plurality of sensors to a respective electrical phase;
determining, for each candidate sensor assignment set, a score indicative of a probability that each sensor is assigned to a correct phase; and
determining, based on the score for each respective candidate sensor assignment set, a correct phase assignment for each sensor.

19. The method of claim 17, wherein re-assigning the sensor to a different polarity comprises:

determining a plurality of candidate sensor orientation sets, each candidate sensor orientation set uniquely assigning each sensor of the plurality of sensors to a respective orientation;

determining, for each candidate sensor orientation set, a score indicative of a probability that an orientation of each sensor is correct; and determining, based on the score for each respective candidate sensor orientation set, a correct polarity of each sensor of the plurality of sensors.

20. The method of claim 13, wherein performing the action includes:

responsive to determining that the sensor is not installed correctly:

outputting a notification indicating the sensor is not installed correctly, or scheduling a service call to re-install the sensor.

\* \* \* \* \*